United States Patent
Kasai et al.

(10) Patent No.: US 8,440,939 B2
(45) Date of Patent: May 14, 2013

(54) ANNEALING DEVICE

(75) Inventors: Shigeru Kasai, Nirasaki (JP); Tomohiro Suzuki, Nirasaki (JP); Sumi Tanaka, Nirasaki (JP); Masatake Yoneda, Nirasaki (JP); Hiroyuki Miyashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 334 days.

(21) Appl. No.: 12/680,221

(22) PCT Filed: Sep. 25, 2008

(86) PCT No.: PCT/JP2008/067244
§ 371 (c)(1),
(2), (4) Date: Aug. 27, 2010

(87) PCT Pub. No.: WO2009/041466
PCT Pub. Date: Apr. 2, 2009

(65) Prior Publication Data
US 2010/0314377 A1    Dec. 16, 2010

(30) Foreign Application Priority Data

Sep. 27, 2007  (JP) .................. 2007-251533
Jan. 18, 2008  (JP) .................. 2008-009503

(51) Int. Cl.
*H05B 3/00*     (2006.01)
(52) U.S. Cl.
USPC .......................................... 219/201; 257/88
(58) Field of Classification Search .............. 219/201; 257/88
See application file for complete search history.

(56) References Cited

U.S. PATENT DOCUMENTS

| 5,655,189 | A | * | 8/1997 | Murano ................ 399/220 |
| 2004/0026706 | A1 | | 2/2004 | Bogner et al. |
| 2005/0067944 | A1 | | 3/2005 | Masuda et al. |
| 2005/0202598 | A1 | | 9/2005 | Suehiro et al. |
| 2007/0084709 | A1 | * | 4/2007 | Koyano et al. ............ 200/341 |
| 2008/0187299 | A1 | | 8/2008 | Shimizu et al. |

FOREIGN PATENT DOCUMENTS

| JP | 05-226693 | A | 9/1993 |
| JP | 5-226693 | A | 9/1993 |
| JP | 2002-49326 | A | 2/2002 |
| JP | 2002-049326 | A | 2/2002 |
| JP | 2003-077852 | A | 3/2003 |
| JP | 2004-506321 | A | 2/2004 |
| JP | 2005-093097 | A | 4/2005 |

(Continued)

OTHER PUBLICATIONS

International Search Report for International application No. PCT/JP2008/067244 mailed Jan. 6, 2009.

(Continued)

*Primary Examiner* — Anthony Ho
(74) *Attorney, Agent, or Firm* — Abelman, Frayne & Schwab

(57) ABSTRACT

Disclosed is an annealing device that includes a processing chamber into which a wafer is received, a heating source having a plurality of light emitting diodes (LEDs) for emitting a light toward the wafer, which faces the surface of the wafer, and a light transmissive member provided corresponding to the heating source, into which the light from the light emitting elements is transmitted. The heating source has the light emitting elements attached on a support toward the wafer. Each of the light emitting elements is individually covered with a lens layer made of a transparent resin.

9 Claims, 22 Drawing Sheets

FOREIGN PATENT DOCUMENTS

| | | |
|---|---|---|
| JP | 2005-175417 A | 6/2005 |
| JP | 2005-259847 A | 9/2005 |
| JP | 2005-536045 A | 11/2005 |
| JP | 2006-059931 A | 3/2006 |
| JP | 2006-351847 A | 12/2006 |
| JP | 2007-116072 A | 5/2007 |
| KR | 10-2005-0013046 A | 2/2005 |
| KR | 10-0618352 B1 | 8/2006 |
| WO | 2006-019090 A | 2/2006 |

OTHER PUBLICATIONS

An Office Action dated May 16, 2011, issued from the Korean Intellectual Property Office (KIPO) of Korean Patent Application No. 10-2010-7002723, and an English translation thereof.

* cited by examiner

ANNEALING DEVICE

This is a U.S. national stage application of International Application No. PCT/JP2008/067244, filed on 25 Sep. 2008. Priority under 35 U.S.C. §119(a) and 35 U.S.C. §365(b) is claimed from Japanese Application No. JP2007-251533, filed 27 Sep. 2007, and from Japanese Application No. JP2008-009503, filed 18 Jan. 2008, the disclosures of which are also incorporated herein by reference.

TECHNICAL FIELD

The present invention relates to an annealing device which performs annealing on a semiconductor wafer or the like by emitting light from a light emitting element, such as a light emitting diode (LED).

BACKGROUND

In fabrication of a semiconductor device, various kinds of heat treatments, such as film formation, oxidation and diffusion, modification, and annealing, are performed on a semiconductor wafer (hereinafter, simply referred to as a wafer) as a to-be-treated substrate. As a semiconductor device is required to have a high speed and to be highly integrated, annealing following ion implantation requires a higher speed of rise and fall of a temperature to minimally inhibit the diffusion. As such an annealing device capable of raising and lowering the temperature at a high speed, there is suggested an annealing device using a light emitting diode (LED) as a heating source (for example, Japanese Laid-Open Patent Publication No. 2005-536045).

However, when the LED is used as the heating source for the annealing device, it is necessary to generate a large amount of light energy in response to rapid heating. Thus, the LED has to be mounted with a high density.

An LED element is a compound semiconductor made of a compound, such as GaAs, GaN, or the like. Such a material has a very high refractive index against light, that is, approximately 2.5~3.6, and thus reflects approximately 15% of the light with even an incident angle of 0°. Accordingly, when such a material is exposed to air, the extracted light efficiency is highly lowered. For this reason, in a case where the light from the LED element is extracted in air (vacuum), it is considered to fill any material having a refractive index between the above mentioned high-refractive index material and air, such as a transparent resin.

Meanwhile, from the standpoint of the shape, the LED element has a length of approximately 0.3~0.5 mm on each side, and a thickness of approximately 0.2 mm. Accordingly, when the bottom surface of the LED element is attached onto a substrate, since the total area of four side surfaces is larger than the area of the top surface, it is important to efficiently extract the emitted light from the side of the LED element. However, when a disposition space of the LED element is merely filled up by a resin as described above, the light emitted from the side of LED element cannot be sufficiently extracted.

SUMMARY OF THE INVENTION

Accordingly, the present invention is to provide an annealing device using a light emitting element, such as a light emitting diode (LED) as a heating source, which can efficiently extract light from the light emitting element.

In accordance with a first embodiment of the present invention, there is provided an annealing device including a processing chamber into which a to-be-treated object is received, a supporting member for supporting the to-be-treated object in the processing chamber, a heating source having a plurality of light emitting elements for emitting a light toward the to-be-treated object, which faces at least one surface of the to-be-treated object on the supporting member, a light transmissive member provided corresponding to the heating source, into which the light from the light emitting elements is transmitted, an exhaust mechanism for exhausting inside of the processing chamber, and a processing gas supply mechanism for supplying a processing gas into the processing chamber. The heating source has a support and the plurality of light emitting elements attached toward the to-be-treated object on the support, and each of the light emitting elements is individually covered with a lens layer.

In the annealing device according to the first embodiment, the lens layer may be preferably made of a transparent resin. Also, the lens layer may be preferably hemispherical. The lens layer may be obtained by forming a hemispherical resin layer on a thin resin layer formed on the support. The hemispherical lens layer may be in contact with other adjacent lens layers or may be apart from other adjacent lens layers.

Preferably, each of the light emitting elements has a square planar shape with each side being 0.5 mm, and the lens layer has a diameter of 0.6~1.2 mm. More preferably, the lens layer has a diameter of 0.8~1.0 mm.

In accordance with a second embodiment of the present invention, there is provided an annealing device including a processing chamber into which a to-be-treated object is received, a supporting member for supporting the to-be-treated object in the processing chamber, a heating source having a plurality of light emitting elements for emitting a light toward the to-be-treated object, which faces at least one surface of the to-be-treated object on the supporting member, a light transmissive member provided corresponding to the heating source, into which the light from the light emitting elements is transmitted, an exhaust mechanism for exhausting inside of the processing chamber, and a processing gas supply mechanism for supplying a processing gas into the processing chamber. The heating source has a support and the plurality of light emitting elements attached toward the to-be-treated object on the support, and a predetermined number of the light emitting elements in a lump are covered with a lens layer.

In the annealing device according to the second embodiment, the lens layer may mainly include a portion made of a transparent resin. The heating source may have a plurality of supports, and a plurality of lens layers corresponding to said supports are formed, and each of said lens layers covers in a lump a plurality of light emitting elements attached to a corresponding support. Also, the lens layer may have a taper in which a surface of a light emitting side becomes narrow. Also, the lens layer may be obtained by forming a resin layer as a main layer, on a thin resin layer formed on the support. In this case, the resin layer as the main layer may have a taper in which a surface of a light emitting side becomes narrow.

In accordance with a third embodiment of the present invention, there is provided an annealing device including a processing chamber into which a to-be-treated object is received, a supporting member for supporting the to-be-treated object in the processing chamber, a heating source having a plurality of light emitting elements for emitting a light toward the to-be-treated object, which faces at least one surface of the to-be-treated object on the supporting member, a light transmissive member provided corresponding to the heating source, into which the light from the light emitting elements is transmitted, an exhaust mechanism for exhausting inside of the processing chamber, and a processing gas supply mechanism for supplying a processing gas into the processing chamber. The heating source has a support and the plurality of light emitting elements attached toward the to-be-treated object on the support, and an edge portion at a light emitting surface of the light emitting element is chamfered.

In the annealing device according to the first to third embodiments, the support may preferably have a reflectivity of 0.8 or more. A space may be formed between the supporting member and the light transmissive member, and the heating source may be provided in the space. Also, the light emitting elements may be LEDs.

According to the present invention, the light emitting elements are typically covered with a lens layer made of a transparent resin. Thus, since the total reflection hardly occurs during the emission of light from the light emitting elements made of a high refractive index material to the air having a low refractive index, it is possible to inhibit the efficiency loss which may be caused by the total reflection. Also, the formation of such a lens layer may effectively extract the light laterally emitted from the light emitting elements, thereby further increasing the extraction efficiency of the light.

Also, in a case where a predetermined number of the light emitting elements in a lump are covered with a lens layer, the same effect as described above can be achieved.

Also, when an edge portion at a light emitting surface of each of the light emitting elements is chamfered, it is possible to refract the horizontal directional light to a center during the extraction of the light from the light emitting portion of the light emitting elements. This increases the extraction efficiency of the light.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, an exemplary embodiment of the present invention will be described with reference to the accompanying drawings. Herein, as an example, an annealing device for annealing a wafer with impurities implanted on the surface thereof will be described.

Figure 1:
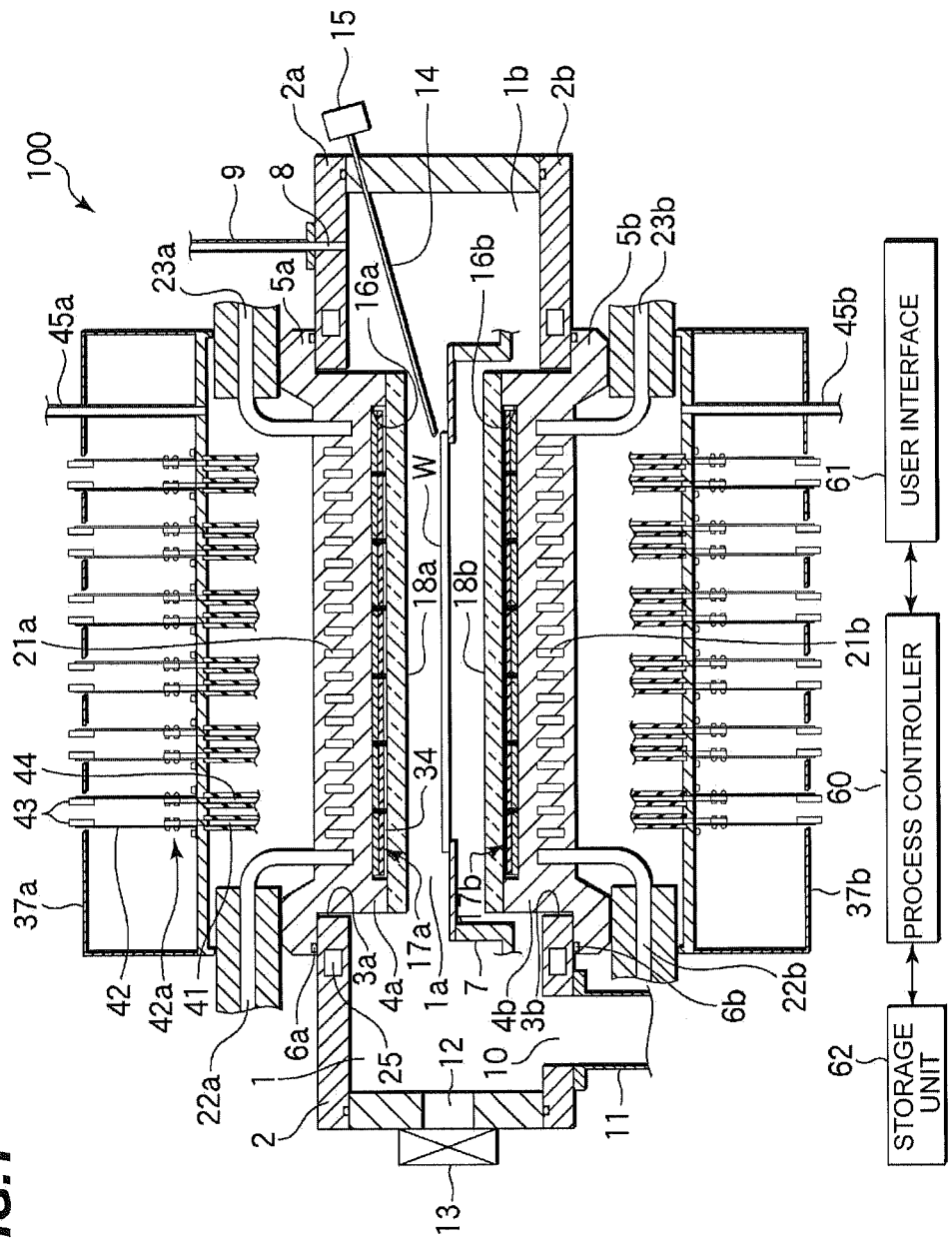
FIG. 1 is a cross-sectional view illustrating a schematic configuration of an annealing device according to a first exemplary embodiment of the present invention.
Figure 2:
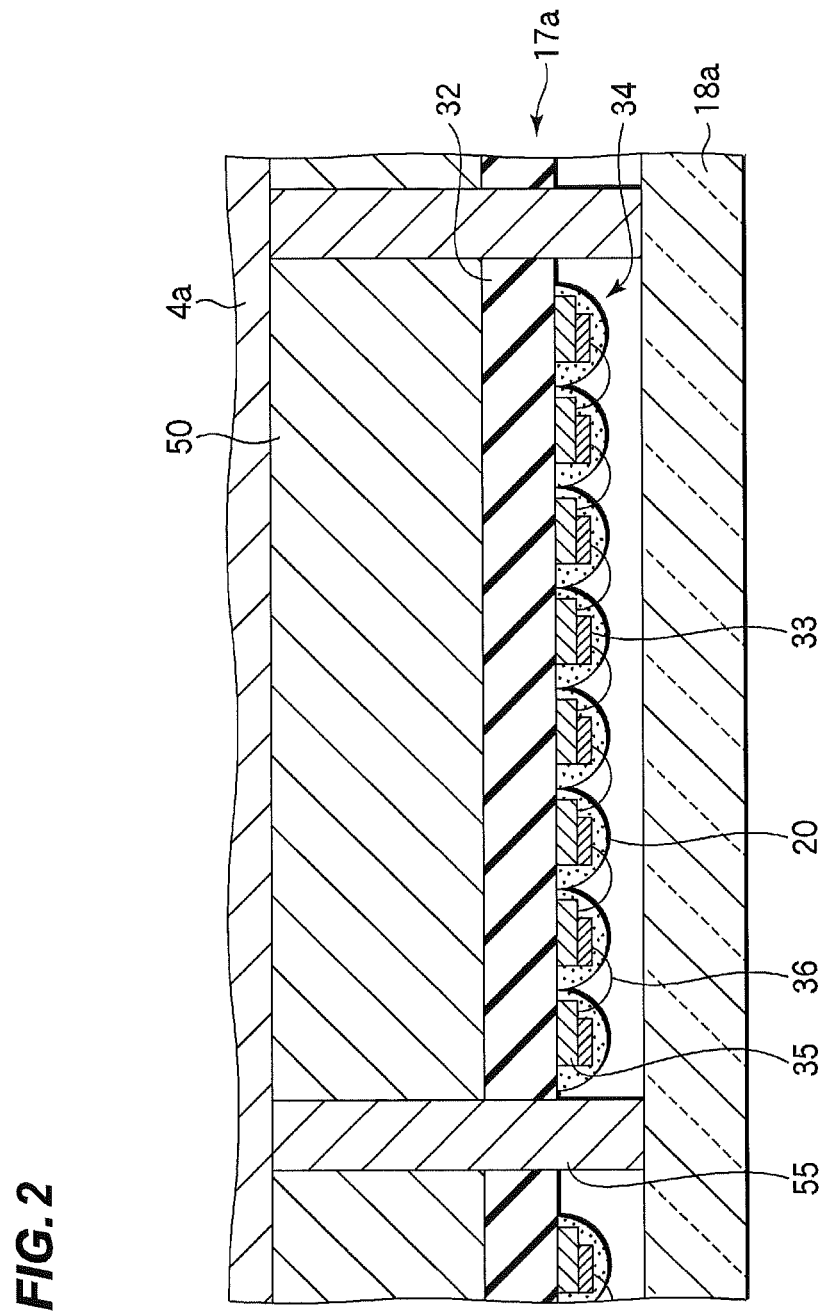
FIG. 2 is an enlarged cross-sectional view illustrating a heating source of the annealing device shown in FIG. 1.
Figure 3:
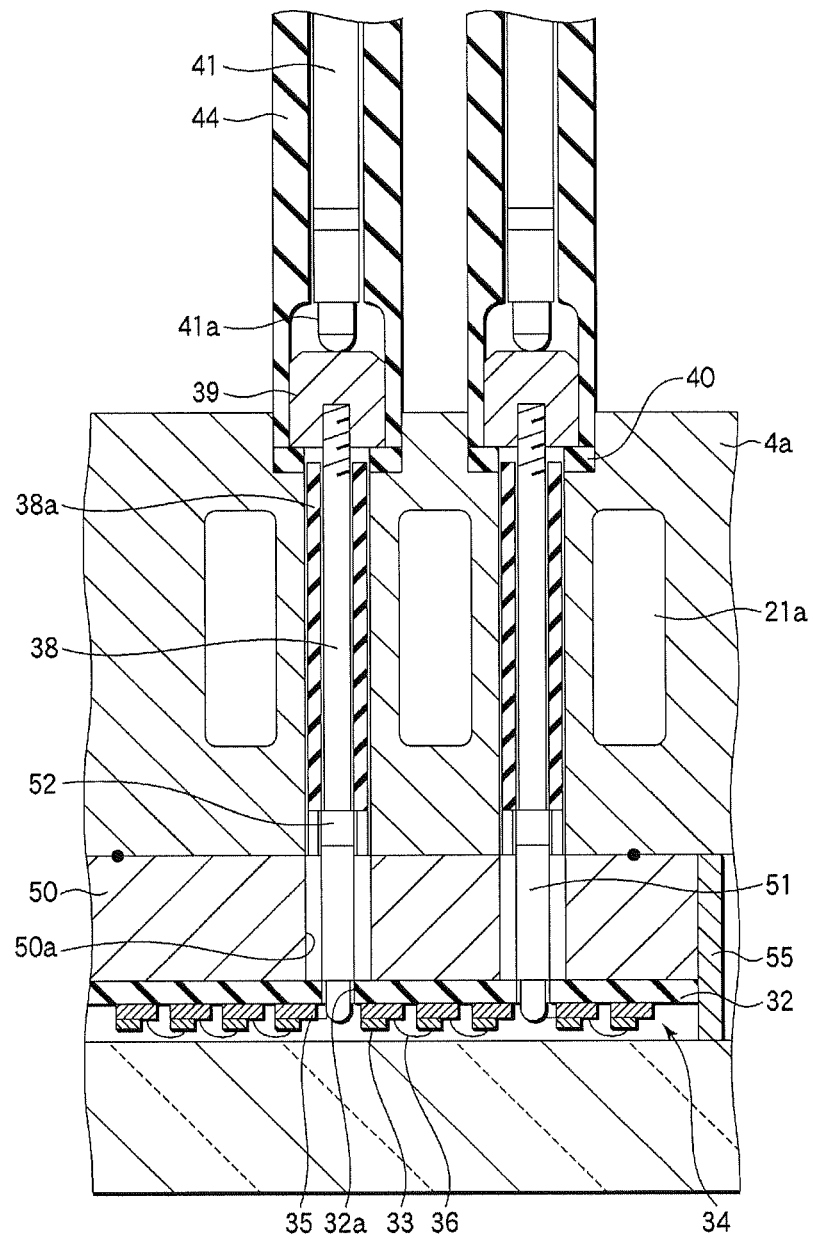
FIG. 3 is an enlarged cross-sectional view illustrating a feeding portion to a light emitting diode (LED) in the annealing device shown in FIG. 1.

FIG. 1 is a cross-sectional view illustrating a schematic configuration of an annealing device according to a first exemplary embodiment of the present invention, FIG. 2 is an enlarged cross-sectional view illustrating a heating source of the annealing device shown in FIG. 1, and FIG. 3 is an enlarged cross-sectional view illustrating a feeding portion to a light emitting diode (LED) in the annealing device shown in FIG. 1. An annealing device 100 has a processing chamber 1 into which a wafer W is loaded and the processing chamber 1 is configured to be airtight.

The processing chamber 1 has a cylindrical annealing processing part 1a and a donut-shaped gas diffusion part 1b. In the annealing processing part 1a, the wafer W is disposed. The gas diffusion part 1b is provided at the outside of the annealing processing part 1a. The gas diffusion part 1b has a height higher than the annealing processing part 1a, and the cross-section of the processing chamber 1 takes an H-shape. The gas diffusion part 1b of the processing chamber 1 is defined by a chamber 2. In an upper wall 2a and a lower wall 2b of the chamber 2, circular holes 3a and 3b corresponding to the annealing processing part 1a are formed, respectively. In these holes 3a and 3b, cooling members 4a and 4b, made of a high heat conductive material (such as copper), are inserted, respectively. The cooling members 4a and 4b have flange parts 5a and 5b, respectively, and are tightly attached by insertion of sealing members 6a and 6b between the flange parts 5a and 5b, and the upper wall 2a and lower wall 2b of the chamber 2. Also, the annealing processing part 1a is defined by the cooling members 4a and 4b.

In the processing chamber 1, a supporting member 7 horizontally supporting the wafer W within the annealing processing part 1a is provided. The supporting member 7 is configured to be moved up and down during the transfer of the wafer W by an elevating mechanism (not shown). Also, in the ceiling wall of the chamber 2, a processing gas inlet port 8 is provided. A predetermined processing gas is introduced to the processing gas inlet port 8 from a processing gas supply mechanism (not shown). Also, the processing gas inlet port 8 is connected to a processing gas pipe 9 for supplying a processing gas. Also, in the bottom wall of the chamber 2, an exhaust port 10 is provided, and the exhaust port 10 is connected to an exhaust pipe 11 which is connected to an exhaust device (not shown). Also, in the lateral wall of the chamber 2, a loading/unloading hole 12 for loading and unloading the wafer W to/from the chamber 2 is provided. The loading/unloading hole 12 is configured to be opened/closed by a gate valve 13. In the processing chamber 1, a temperature sensor 14 for measuring the temperature of the wafer W supported by the supporting member 7 is provided. Also, the temperature sensor 14 is connected to a measuring part 15 at the outside of the chamber 2. A temperature detection signal is output from the measuring part 15 to a process controller 60 which will be described later.

The surfaces of the cooling members 4a and 4b, which face the wafer W supported by the supporting member 7, have circular recess portions 16a and 16b formed thereon. In the recess portions 16a and 16b, heating sources 17a and 17b are disposed. The heating sources 17a and 17b are mounted with LEDs such that they can directly contact with the cooling members 4a and 4b.

The surfaces of the cooling members 4a and 4b, which face the wafer W, have light transmissive members 18a and 18b fixed by screws thereon. The light transmissive members 18a and 18b are provided such that they cover the recess portions 16a and 16b, and transmit the lights from the LEDs mounted in the heating sources 17a and 17b to the wafer W side. For the light transmissive members 18a and 18b, a material which is capable of efficiently transmitting the light emitted from the LEDs is used. For example, quartz is used.

In the cooling members 4a and 4b, cooling medium flow passages 21a and 21b are provided. Within the cooling medium flow passages 21a and 21b, a liquid-state cooling medium capable of cooling the cooling members 4a and 4b below 0° C., for example, to about −50° C. flows. Examples of the cooling medium include fluorinated inert liquids, such as Florinate, Galden, or the like (trade name). Cooling medium supply pipes 22a and 22b, and cooling medium discharge pipes 23a and 23b are connected to the cooling medium flow passages 21a and 21b of the cooling members 4a and 4b. Also, the cooling medium flow passages 21a and 21b are configured to be able to cool the cooling members 4a and 4b by circulating the cooling medium therein.

In the chamber 2, a coolant flow passage 25 is formed. A room temperature coolant can flow within the coolant flow passage 25, thereby preventing the temperature of the chamber 2 from excessively increasing.

Each of the heating sources 17a and 17b, as enlargedly shown in FIG. 2, has a support 32, multiple LEDs 33, and a plurality of LED arrays 34. Herein, the support 32 is made of an insulating and high heat conductive material, and typically made of AlN ceramics. The LEDs 33 are supported by the support 32. The LED arrays 34 include a thermal diffusion member 50 which is made of a high heat conductive material (Cu), and is soldered or brazed to the other side of the support 32. The other side of the LED arrays 34 is fixed on the lower surface of the cooling member 4a in the heating source 17a, or on the upper surface of the cooling member 4b in the heating source 17b, by screws with a paste inserted therebetween. Examples of the paste include good heat conductive materials, such as silicon grease, silver paste, or the like. The space between adjacent LED arrays 34 is partitioned by a partition member 55. In the LED arrays 34, between the support 32 and the LEDs 33, high conductive electrodes 35 (for example, made of copper plated with gold) are provided in an overall contact state. Also, a wire 36 is connected between electrodes 35 of two adjacent LEDs 33. Through the above described configuration, the cold heat highly efficiently transferred from the cooling medium to the high heat conductive cooling members 4a and 4b reaches the LEDs 33 via the thermal diffusion member 50, the support 32, and the electrodes 35. The thermal diffusion member 50, the support 32, and the electrodes 35 are highly heat conductive and are in overall contact with the cooling members 4a and 4b. Thus, the LEDs 33 are cooled with a very high efficiency.

Each of the LEDs 33 is covered with, for example, a lens layer 20 made of a transparent resin. The lens layer 20 functions to extract the light emitted from the LED 33, and can extract the light from the lateral surface of the LED 33. There is no limitation in the shape of the lens layer 20 as long as the lens layer 20 has a lens function. However, in consideration of ease and efficiency in the fabrication, an approximately hemispherical shape is preferable. The lens layer 20 will be described later in detail.

The space between the support 32 and the light transmissive members 18a and 18b is in a vacuum state.

At the upper side of the cooling member 4a, and at the lower side of the cooling member 4b, control boxes 37a and 37b for controlling the power feed for the LEDs 33 are provided, respectively. The control boxes 37a and 37b are connected to the wiring from a power supply (not shown), such that they control the power feed for the LEDs 33.

Meanwhile, as enlargedly shown in FIG. 3, holes 50a and 32a which are formed in the thermal diffusion member 50 and the support 32, respectively, have power feeding electrodes 51 inserted therein. The power feeding electrodes 51 are connected to the electrodes 35 by soldering. Also, electrode rods 38 extending through the inside of the cooling members 4a and 4b are connected to the power feeding electrodes 51 at attachment ports 52. In each of the LED arrays 34, a plurality of electrode rods 38, for example, 8 electrode rods (only two are shown in FIGS. 1 and 3), are provided. Each of the electrode rods 38 is covered with a protective cover 38a made of an insulating material. The electrode rod 38 extends up to the upper end portion of the cooling member 4a, and up to the lower end portion of the cooling member 4b, and at the upper end portion and the lower end portion, a receiving member 39 is fixed by screws. An insulating ring 40 is intervened between the receiving member 39 and the cooling member 4a and 4b. Herein, the gaps, between the protective cover 38a and the cooling member 4a (4b), and between the protective cover 38a and the electrode rod 38, are soldered, thereby forming so-called feed-throughs.

As shown in FIG. 1, a plurality of control boards 42 are provided within the control box 37a and 37b. Each of the control boards 42 includes a connection 42a, and a power-feeding connector 43. A power-feeding member 41 corresponding to the electrode rod 38 is connected to the connection 42a, and the wiring from a power supply is connected to the power-feeding connector 43. As shown in FIG. 3, the power-feeding member 41 extends downward, thereby connecting to the receiving member 39 attached to each of the electrode rods 38. The power-feeding member 41 is covered with a protective cover 44 made of an insulating material. At the leading end of the power-feeding member 41, a Pogopin (spring pin) 41a is provided. By the contact of each Pogopin 41a with the corresponding receiving member 39, power is fed to each of the LEDs 33 from the control box 37a and 37b, via the power-feeding member 41, the electrode rod 38, the power feeding electrode 51, and the electrode 35 of the heating source 17a and 17b. Through the power-feed as described above, the LEDs 33 emit light, and the light heats the wafer W from inner and outer surfaces, thereby carrying out annealing. The Pogopin 41a is pressed down to the receiving member 39 side by a spring. Thus, even in a case where the attachment position of the control board 42 is out of line, it is possible to securely contact the power-feeding member 41 with the electrode rod 38. In FIG. 1, only half of the power-feeding member 41 is shown, and the structures of the electrode rod 38, the power feeding electrode 51, or the interconnection therebetween are omitted. Also, in FIG. 2, the power feeding electrode 51 is omitted.

Figure 4:
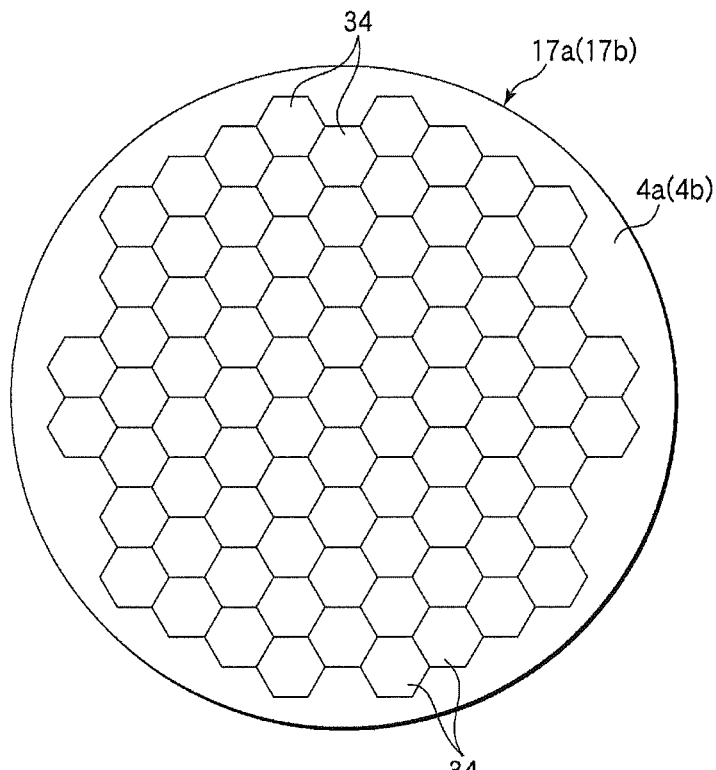
FIG. 4 is a bottom view illustrating a heating source of the annealing device shown in FIG. 1.

Each of the LED arrays 34 is hexagonal, and is, for example, disposed as shown in FIG. 4. In each of the LED arrays 34, about 1000~2000 LEDs 33 are mounted. As the LEDs 33, LEDs having an emitted-light's wavelength between ultraviolet (UV) light and near infrared (IR) light, preferably a wavelength of 0.36 to 1.0 μm are used. Such a material having an emitted-light's wavelength of 0.36 to 1.0 μm may include a compound semiconductor based on GaN, GaAs, GaP, or the like.

The respective components of the annealing device 100 are connected to the process controller 60 provided with a micro processor (computer), and controlled by the process controller 60, as shown in FIG. 1. For example, the control of the power-feed of the control boxes 37a and 37b, the control of a driving system, and the control of the gas supply are performed by the process controller 60. A keyboard or a user interface 61 is connected to the process controller 60. An operator performs the input of a command for managing the annealing device 100 by the keyboard. The user interface 61 includes a display, etc. for visually displaying the operation state of the annealing device 100. Also, a storage unit 62 is connected to the process controller 60. The storage unit 62 can store a processing recipe. The processing recipe includes a control program for allowing various processings in the annealing device 100 to be performed under the control of the process controller 60, or a program for performing processings in the respective components of the annealing device 100 according to processing conditions. The processing recipe is stored in a storage medium within the storage unit 62. The storage medium may be a fixed-type medium, such as a hard disk, or a portable-type medium, such as CD ROM, DVD, flash memory, etc. Also, the recipe may be appropriately transmitted from another device, for example, via a dedicated line. Also, any recipe, as required, is retrieved from the storage unit 62 in accordance with the instruction, etc. from the user interface 61, and is executed in the process controller 60, thereby performing a required process in the annealing device 100 under the control of the process controller 60.

Hereinafter, the lens layer 20 will be described in detail.

As described above, the lens layer 20 is made of, for example, a transparent resin, covers each of the LEDs 33, and typically takes a hemispherical shape. The lens layer 20 has a refractive index between the LEDs 33 and the air, and herein, the LEDs 33 have a high refractive index and the air has a refractive index of 1. Also, the lens layer is formed so as to reduce the total reflection caused by the direct emission of the light from the LEDs 33 to the air. In the case of the LED is made of GaAs, since the LED has a refractive index of about 3.4, the lens layer 20 is preferably made of a transparent resin having a refractive index of about 1.84.

The reason is as follows.

Figure 5:
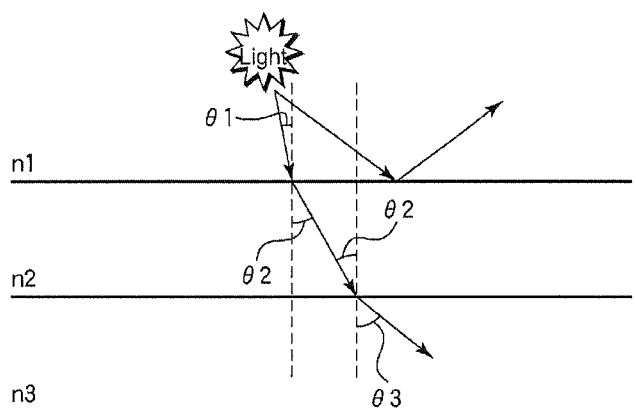
FIG. 5 is a view illustrating a model in a state where a light emitted from a material having a refractive index of n1 is transmitted through a lens material having a refractive index of n2, and then is transmitted to air with n3=1.

As shown in FIG. 5, when the light emitted from a material having a refractive index of n1 is transmitted through a lens material having a refractive index of n2, and then is transmitted to air with n3=1, the optimum of n2 can be obtained. By considering that a lens is semicircular, and a light emitting portion is smaller than the lens, when it is assumed that θ1≈0, θ2≈0, and θ3≈0, the reflectivity R may be expressed as the following equation (1):

$$R = \left\| \frac{n1\cos\theta1 - n2\cos\theta2}{n1\cos\theta1 + n2\cos\theta2} \right\|^2 = \left\| \frac{n1 - n2}{n1 + n2} \right\|^2 \quad (1)$$

Since the transmissivity is 1−R, the transmissivity T from material 1 to material 3 may be expressed as the following equation (2):

$$T = (1 - R12) \times (1 - R23) = \left(1 - \left(\frac{n1 - n2}{n1 + n2}\right)^2\right)\left(1 - \left(\frac{n2 - n3}{n2 + n3}\right)^2\right) \quad (2)$$

Equation (2) is a function having a maximum value. Thus, when partial differentiation of T is performed with respect to n2, the calculated result is expressed as the following equation (3), and is briefly expressed as the following equation (4):

$$\frac{\partial T}{\partial n2} = \frac{\partial}{\partial n2}\left(\frac{4n1n2}{(n1+n2)^2}\right)\left(\frac{4n2n3}{(n2+n3)^2}\right) = \frac{\partial}{\partial n2}\left(\frac{16n1n2^2n3}{(n1+n2)^2(n2+n3)^2}\right) \quad (3)$$

$$\frac{\partial T}{\partial n2} = \frac{32n1n2n3(n1+n2)(n2+n3)(n1n3-n2^2)}{(n1+n2)^4(n2+n3)^4} \quad (4)$$

Since the right side is 0 in Equation (4) at an inflection point, the calculation result is expressed as the following equation (5):

$$n2=(n1 \cdot n3)^{1/2} \quad (5)$$

Since the refractive index of GaAs is about 3.4, $n2=3.4^{1/2}=1.84$ from Equation (5). Accordingly, when the refractive index of the lens layer 20 is 1.84, the transmissivity is maximized.

In the case where there is no lens layer 20, when n1=3.4 (reflectivity of GaAs: about 3.4) is substituted into Equation (2), the transmissivity T=1−{(3.4−1)/(3.4+1)}²=0.702.

Meanwhile, in the case where there exists the lens layer 20, n1=3.4, and n2=1.84 are substituted into Equation (2), the transmissivity T=[1−{(3.4−1.84)/(3.4+1.84)}²]×[{(1.84−1)/(1.84+1)}²]=0.789.

Accordingly, the use of the lens layer 20 having a refractive index of 1.84 increases the light extracted to the outside by about 12%.

Such a lens layer 20 is preferably made of a silicon resin. The silicon resin generally has a slightly low refractive index of about 1.4, but shows a high light transmittance due to its high transparency. A silicon resin having a refractive index of about 1.5 has been recently developed. A higher efficiency can be achieved as the refractive index of a silicon resin approaches 1.8 as close as possible. Also, in the case of an IR LED, an epoxy resin may be used. The epoxy resin has a refractive index of about 1.5, and can efficiently extract the light.

In a case where a planar resin layer is formed on an LED, it is possible to efficiently extract the light perpendicularly emitted from the LED However, in this case, the light laterally or diagonally emitted from the LED is absorbed by the support 32 through reflection, and thus cannot be efficiently extracted. The LEDs 33 generally has a thickness of about 0.2 mm, and a length of about 0.3~0.5 mm on each side. Accordingly, in a case where the bottom surface of the LED is attached onto the substrate, since the total area of four side surfaces is larger than the area of the top surface, it is important to highly efficiently extract the laterally emitted light.

Figure 6:
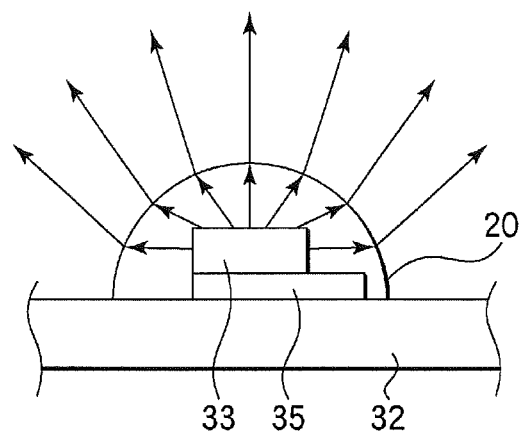
FIG. 6 is an enlarged view illustrating the formation state of a lens layer.

Accordingly, in the present exemplary embodiment, as shown in the enlarged view of FIG. 6, each of the LEDs 33 is covered with the lens layer 20. This allows the laterally emitted light to be effectively extracted to the outside. Thus, it is possible to efficiently extract the light emitted from the LEDs 33.

In this case, in order to more efficiently extract the light from the LEDs 33, the lens layer 20 is preferably larger than each of the LEDs 33. However, the number of the LEDs 33 which can be arrayed is reduced when the lens layer 20 is excessively large, thereby reducing the power per unit area. For this reason, the lens layer preferably has an appropriate size according to the size of each of the LEDs 33. The LED 33, as described above, has a length of about 0.3~0.5 mm on each side. However, it was found that a square having a length of 0.5 mm on each side shows the highest efficiency. In this case, the diameter of the lens layer 20 is preferably in a range of about 0.6~1.2 mm. When the lens layer 20 is controlled as described above, it is possible to increase the extraction efficiency of the light up to two times or more, compared to the case where the planar resin layer is used.

Figure 7:
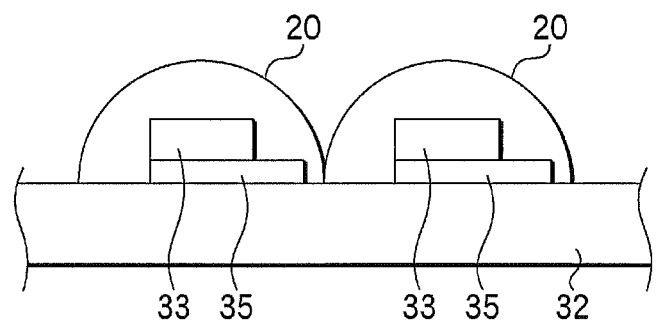
FIG. 7 is a view illustrating a preferable shape of a lens layer from the standpoint of efficiency.
Figure 8A:
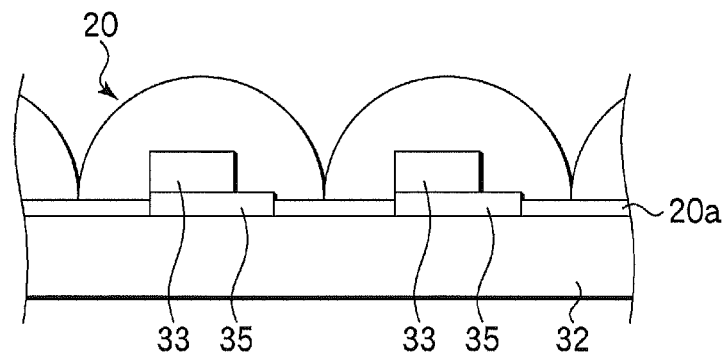
FIG. 8A is a view illustrating one preferable shape of a lens layer from the standpoint of fabrication.
Figure 8B:
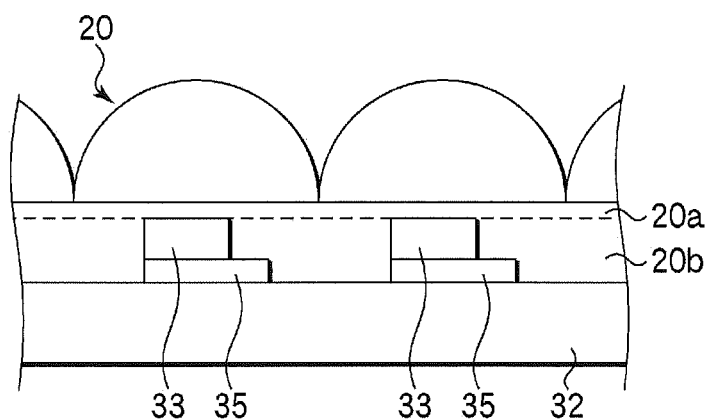
FIG. 8B is a view illustrating another preferable shape of a lens layer from the standpoint of fabrication.
Figure 9:
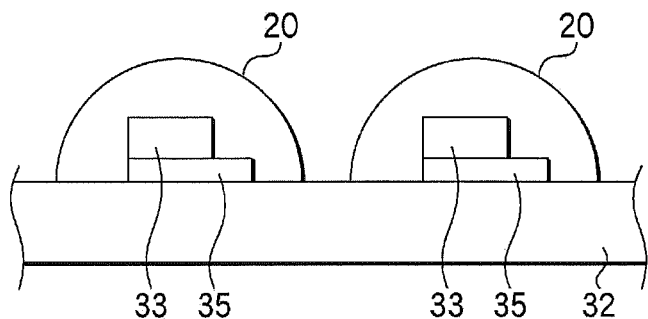
FIG. 9 is a view illustrating a further preferable shape of a lens layer from the standpoint of fabrication.

The lens layer 20, as described above, preferably takes a hemispherical shape in order to increase the efficiency. Also, as shown in FIG. 7, the lens layers 20 are preferably disposed while contacting with each other in order to increase the efficiency. However, when the lens layer 20 is directly disposed on the support 32 without a gap, as described above, the fabrication may be difficult due to the drop of the resin. Thus, in this case, it is preferable to form a thin resin layer 20a of about 0.05 mm on the overall surface of the support 32 prior to the formation of the hemispherical layer, as shown in FIG. 8A, in order to facilitate the fabrication in spite of a slight reduction in the efficiency. Also, although the efficiency is slightly reduced, the gaps between the LEDs 33 may be filled up by a resin layer 20b and a thin resin layer 20a of about 0.05 mm may be formed thereon, prior to the formation of the hemispherical layer, as shown in FIG. 8B. Likewise, a gap of about 0.14~4 mm between the adjacent lens layers 20 may be formed as shown in FIG. 9 from the standpoint of facilitation of the fabrication. In this case, the efficiency is slightly reduced compared to the case where the adjacent lens layers 20 are in contact with each other.

As described above, the extraction efficiency of the light from the LED 33 can be increased by the disposition of the lens layer 20 or the like, but it is also highly dependent on the reflectivity of the support 32. In other words, the light emitted toward the support 32 is reflected according to the reflectivity of the support 32, thereby contributing to the heating of the wafer W. Thus, the support 32 preferably has higher reflectivity. However, the support 32 made of AlN, used in the present exemplary embodiment, has a low reflectivity of about 0.2, and thus absorbs about 80% of the light emitted from the LED 33 toward the support 32. In order to efficiently extract the light emitted toward the support 32, it is preferable to increase the reflectivity by coating the surface of the support 32 with a high reflectivity material. For example, the coating of a white material, such as $TiO_2$, may increase the reflectivity up to about 80%. The increase in the reflectivity of the support 32 up to about 80%, in addition to the use of the lens layer 20, makes it possible to increase the light extraction efficiency about 5 times higher than the case where the planar resin layer is formed.

Hereinafter, the result of a simulation on the influence of the size, the shape, and the disposition of the lens layer 20, and the reflectivity of the support on the light intensity reaching the wafer will be described.

Herein, a LightTools program available from Optical Research Associate was used as a simulator, and an LED with a size of 0.5 (L)×0.5 (W)×0.2 (H) mm was used. While the diameter of a silicon resin lens layer, and the position of the LED are changed, a light ray reaching a position 10 mm apart from the LED was traced. Herein, it was assumed that there exists a Fresnel reflection loss/refraction in the interface between the silicon resin and the air. Also, the reflectivity of the support was set as 0.2 corresponding to AlN, and as 0.8 corresponding to AlN coated with $TiO_2$. Also, the reflectivity of the adjacent LED was set as 0.2. The light intensity was normalized as the intensity of the LED coated with a planar resin being 1 (one).

Figure 10:
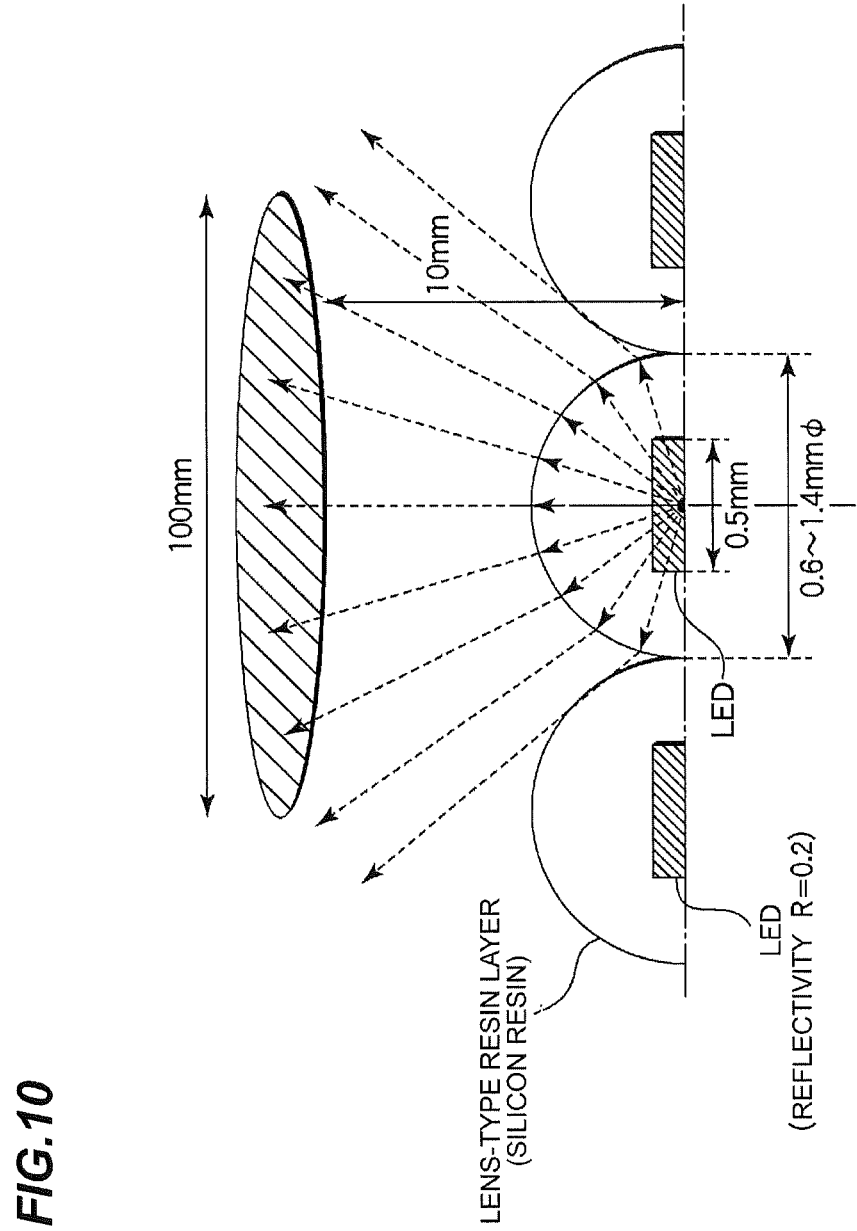
FIG. 10 is an explanatory view illustrating a simulation condition for determining the relationship between the size of a hemispherical lens layer and the light intensity.
Figure 11:
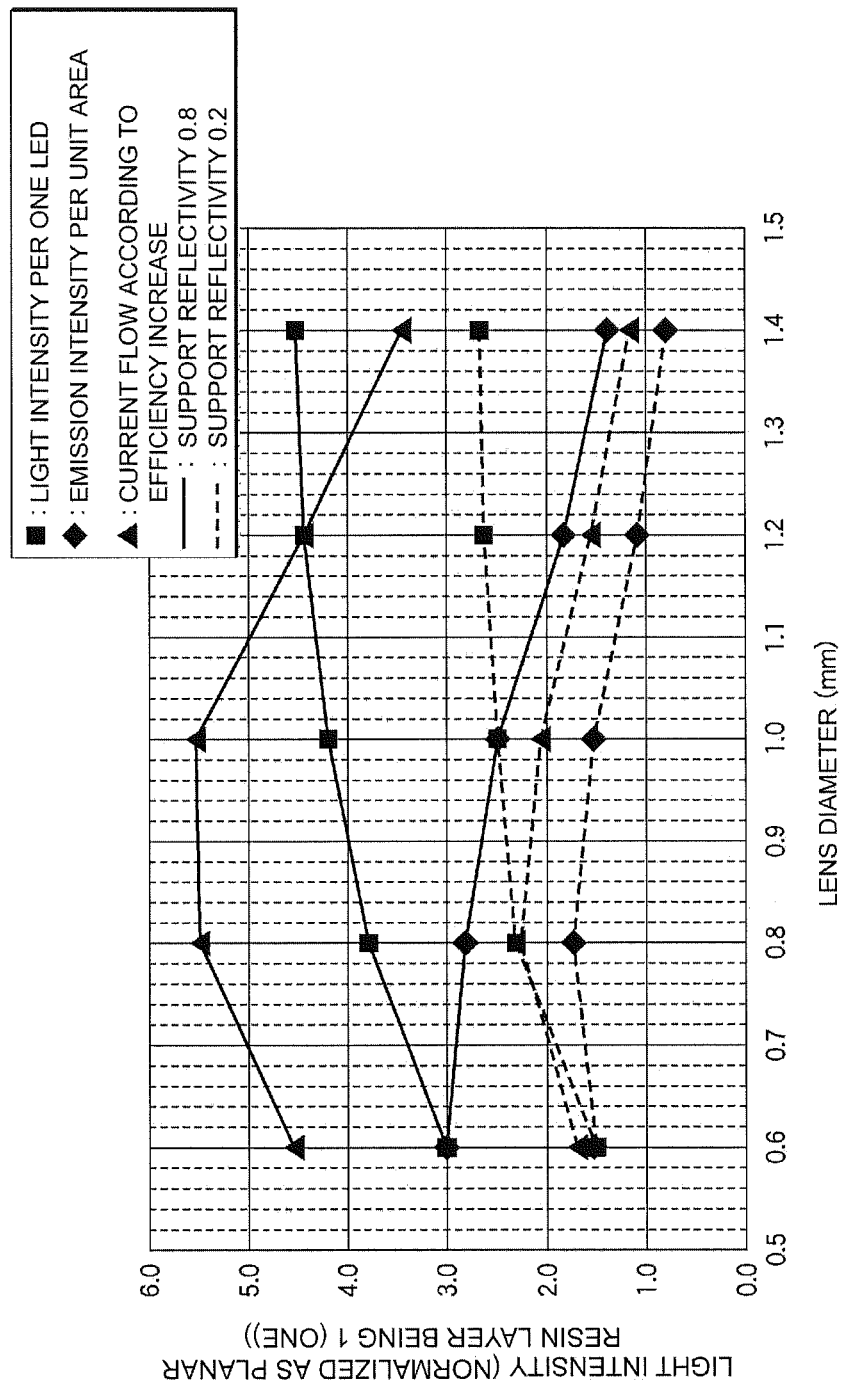
FIG. 11 is a graph showing the result of the simulation in FIG. 10.
Figure 12:
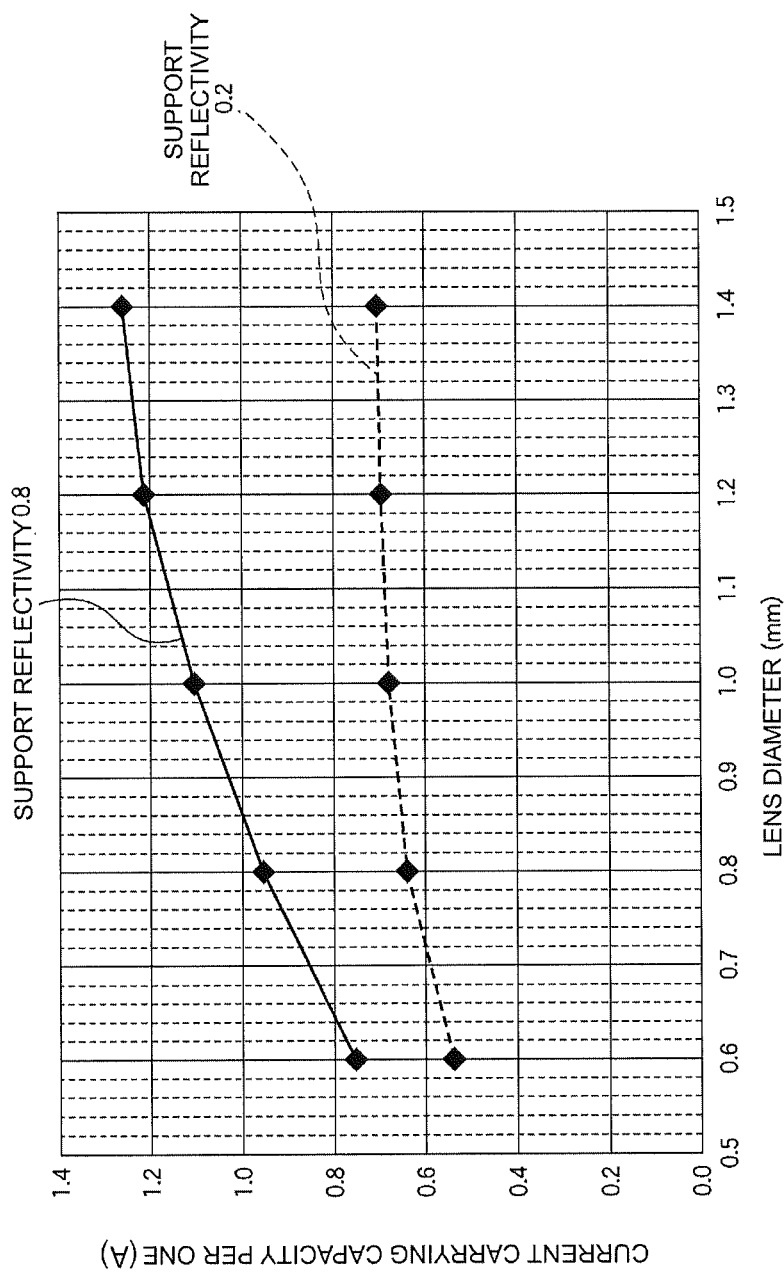
FIG. 12 is a graph showing the relationship between the diameter of a lens-type resin layer and the current carrying capacity per one LED under the condition shown in FIG. 10.

First, as shown in FIG. 10, the lens layers took a hemispherical shape, and were disposed such that adjacent ones are in contact with each other. Then, the diameter of the lens layer was changed from 0.6 to 1.4 mmϕ. The result is shown in FIG. 11. As shown in FIG. 11, it can be seen that the use of the lens layer made it possible to obtain the light intensity about two times higher than the use of the planar resin layer by the support having a reflectivity of 0.2, and to obtain the light intensity about five times higher than the use of the planar resin layer by the support having a reflectivity of 0.8. Also, since the extraction efficiency of the light from the LED increases according to an increase in the diameter of the lens layer, the light intensity per one LED increases according to an increase in the diameter of the lens layer. However, the emission intensity per unit area is reduced since the integration degree of LEDs is reduced according to an increase in the diameter of the lens layer. Meanwhile, when the diameter of the lens layer increases, the light extraction efficiency becomes satisfactory, and the temperature increase of the LED is inhibited. This increases the current carrying capacity (allowable current) per one LED as shown in FIG. 12. Accordingly, the current value increased based on this was applied to an actual device, and the result is shown as a triangular plot in FIG. 11. In view of this triangular plot, it can be seen that for the support having a reflectivity of 0.2, a light intensity value of about 1.5 to 2.3 is obtained when the diameter of the lens layer is in a range of 0.6 to 1.2 mm, and for the support having a reflectivity of 0.8, a light intensity value of about 4.5 to 5.5 is obtained when the diameter of the lens layer is in a range of 0.6 to 1.2 mm. Especially, when the diameter of the lens layer is in a range of 0.8 to 1 mm, it can be seen that a light intensity of about 2.1 to 2.3 is obtained when the support has a reflectivity of 0.2, and a high light intensity of about 5.5 is obtained when the support has a reflectivity of 0.8. Accordingly, it can be determined that when an LED has a length of 0.5 mm on each side, the diameter of the lens layer is preferably in a range of 0.6 to 1.2 mm, and more preferably in a range of 0.8 to 1.0 mm.

Figure 13:
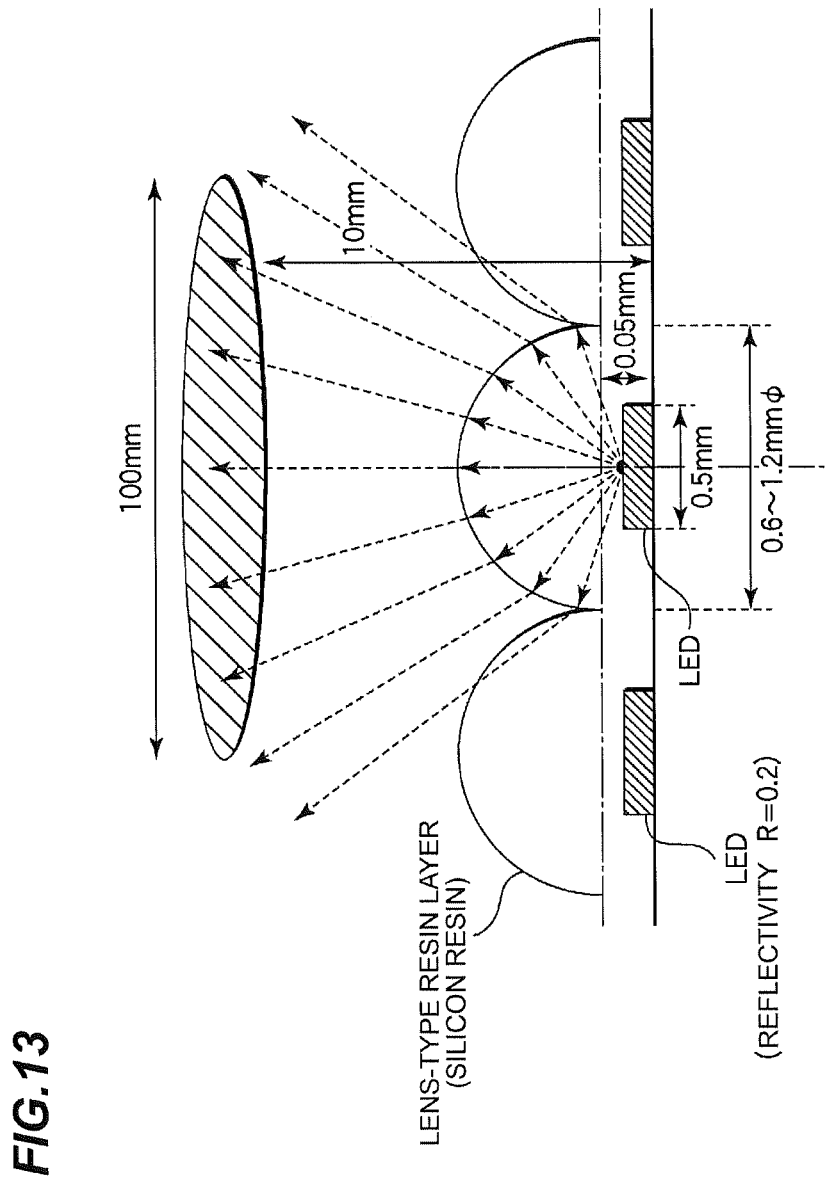
FIG. 13 is an explanatory view illustrating a simulation for determining the relationship between the size of a lens layer and the light intensity, in which the lens layer is obtained by forming a hemispherical resin layer on a thin resin layer.
Figure 14:
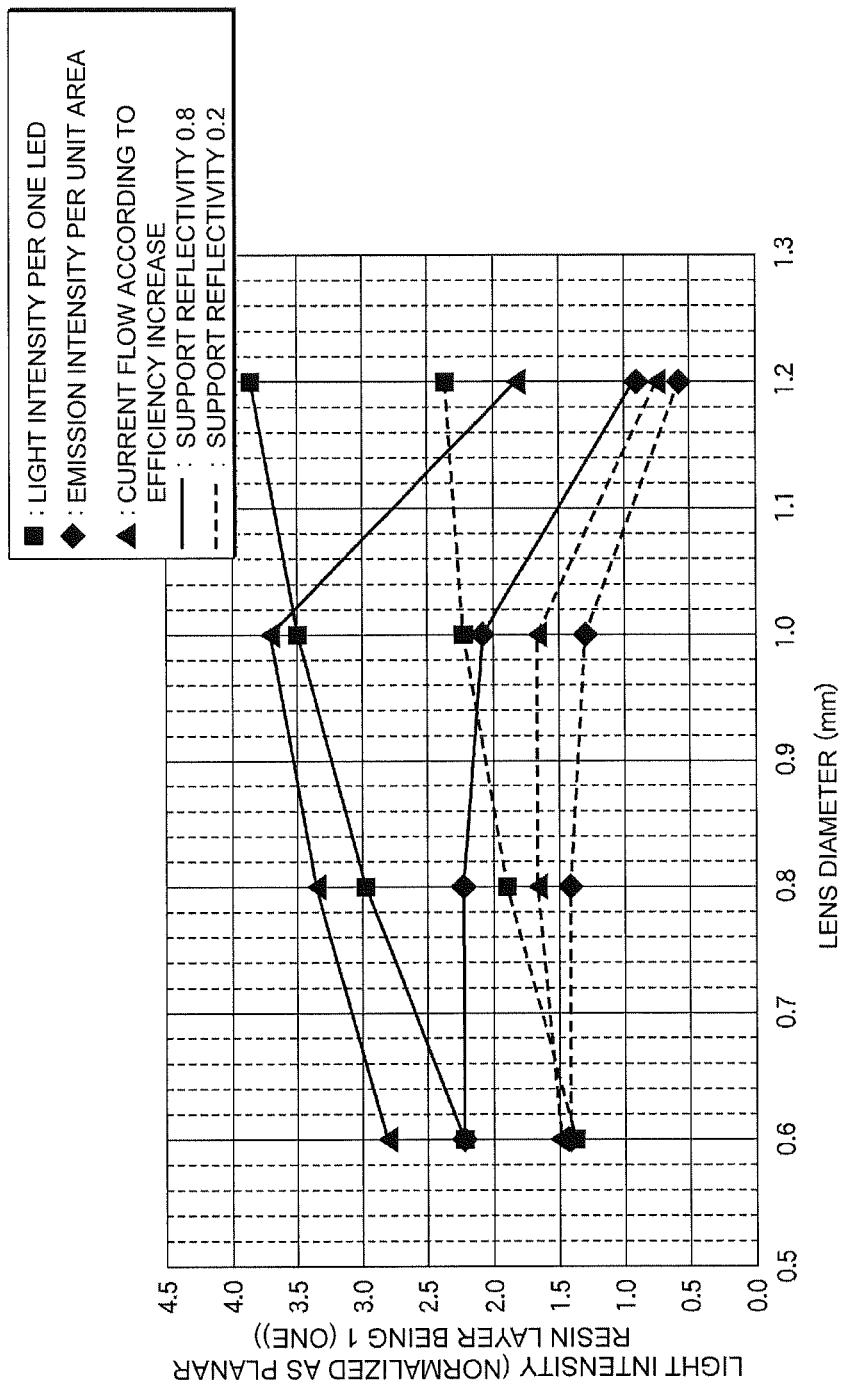
FIG. 14 is a graph showing the result of the simulation in FIG. 13.
Figure 15:
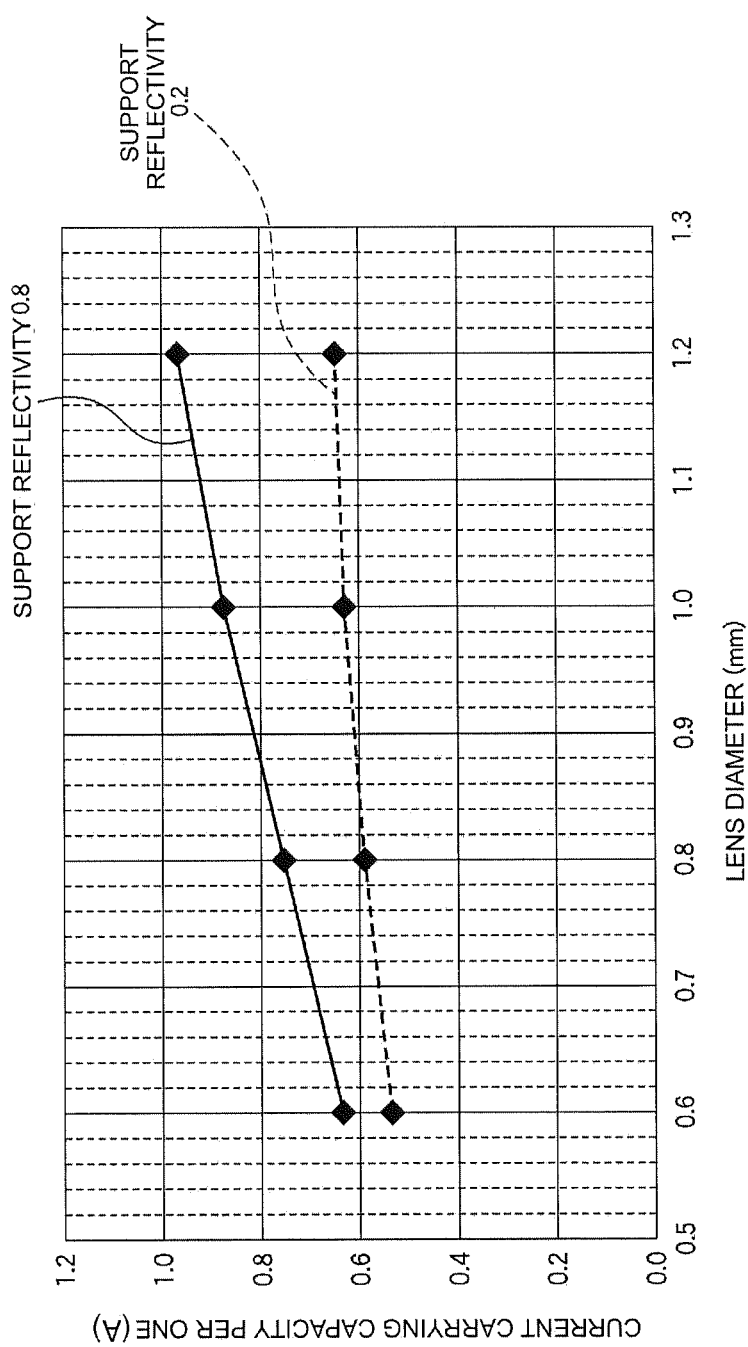
FIG. 15 is a graph showing the relationship between the diameter of a lens layer and the current carrying capacity per one LED under the condition shown in FIG. 13.

Next, as shown in FIG. 13, a thin resin layer with a thickness of 0.05 mm was formed at first, and then the same hemispherical resin layer as that in FIG. 10 was formed as a lens layer. Then, the diameter of the lens layer was changed from 0.6 to 1.2 mm$\phi$. The results are shown in FIG. 14. As shown in FIG. 14, it can be seen that the formation of the thin resin layer as a base slightly reduced the light intensity, compared to the application of only the hemispherical lens layer. Schematically, it is possible to obtain the light intensity about 1.5 times higher than the use of the planar resin layer, with the support having a reflectivity of 0.2, and to obtain the light intensity about 3.5 times higher than the use of the planar resin layer, with the support having a reflectivity of 0.8. Also, in the same manner as that shown in FIG. 11, the light intensity per one LED increases according to an increase in the diameter of the lens layer. However, when the diameter of the lens layer is increased, the emission intensity per unit area is reduced. In the same manner as that shown in FIG. 12, the current carrying capacity per one LED was increased as shown in FIG. 15. Accordingly, the current value increased based on this was applied to an actual device, and the result is shown as a triangular plot in FIG. 14. In view of this triangular plot, it can be seen that for the support having a reflectivity of 0.2, a light intensity value of about 1.5 to 1.7 is obtained when the diameter of the lens layer is in a range of 0.6 to 1.0 mm, and for the support having a reflectivity of 0.8, a light intensity value of about 2.8 to 3.6 is obtained when the diameter of the lens layer is in a range of 0.6 to 1.0 mm. Especially, when the diameter of the lens layer is in a range of 0.8 to 1 mm, it can be seen that a light intensity of about 1.7 is obtained when the support has a reflectivity of 0.2, and a high light intensity of about 3.4 to 3.6 is obtained when the support has a reflectivity of 0.8. Accordingly, it can be determined that the formation of a thin resin layer as a base slightly reduces the efficiency, compared to the application of only the hemispherical lens layer, but can achieve almost the same tendency as the application of only the hemispherical lens layer. Also, it can be seen that when an LED has a length of 0.5 mm on each side, the diameter of the lens layer is preferably in a range of 0.6 to 1.0 mm, and more preferably in a range of 0.8 to 1.0 mm.

Figure 16:
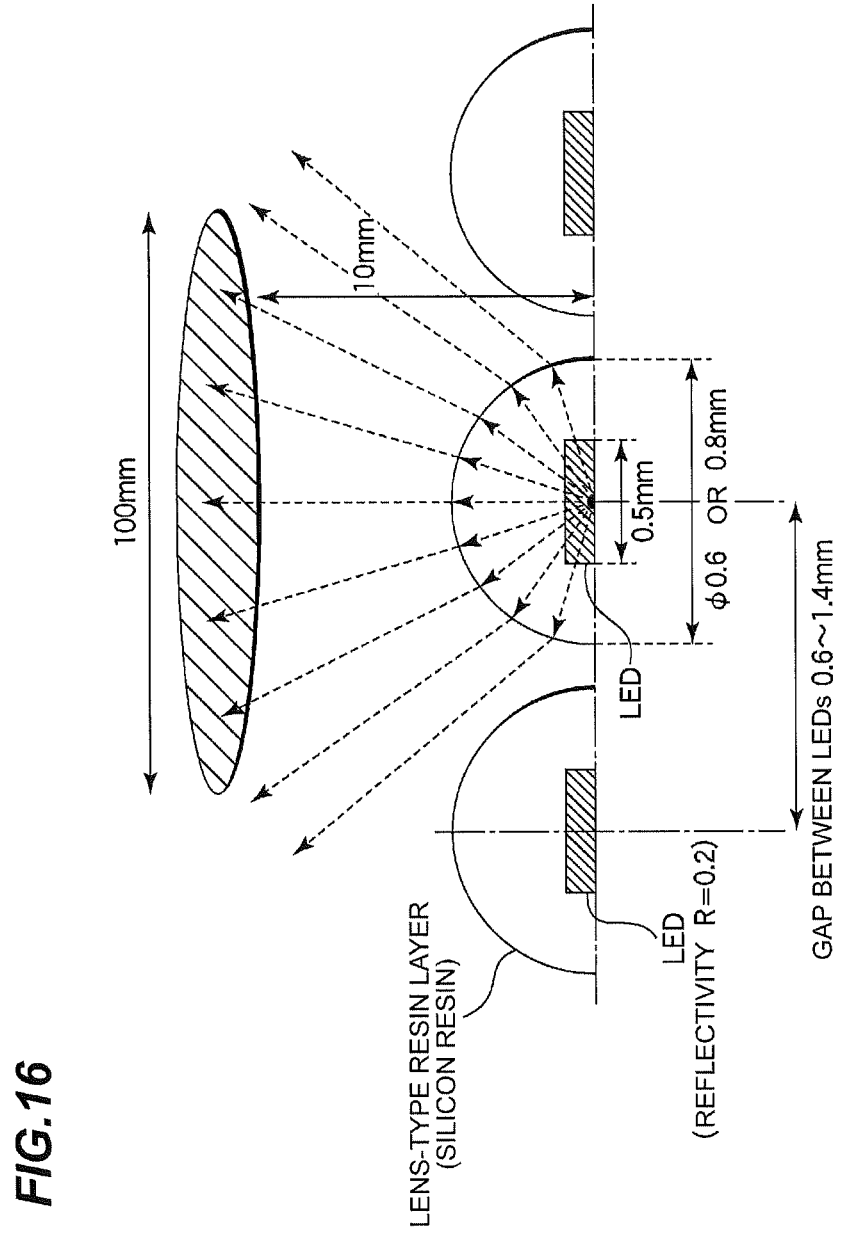
FIG. 16 is an explanatory view illustrating a simulation for determining a change in the light intensity in a state where the diameter of a lens layer was fixed, and the gap between adjacent LEDs was changed.
Figure 17:
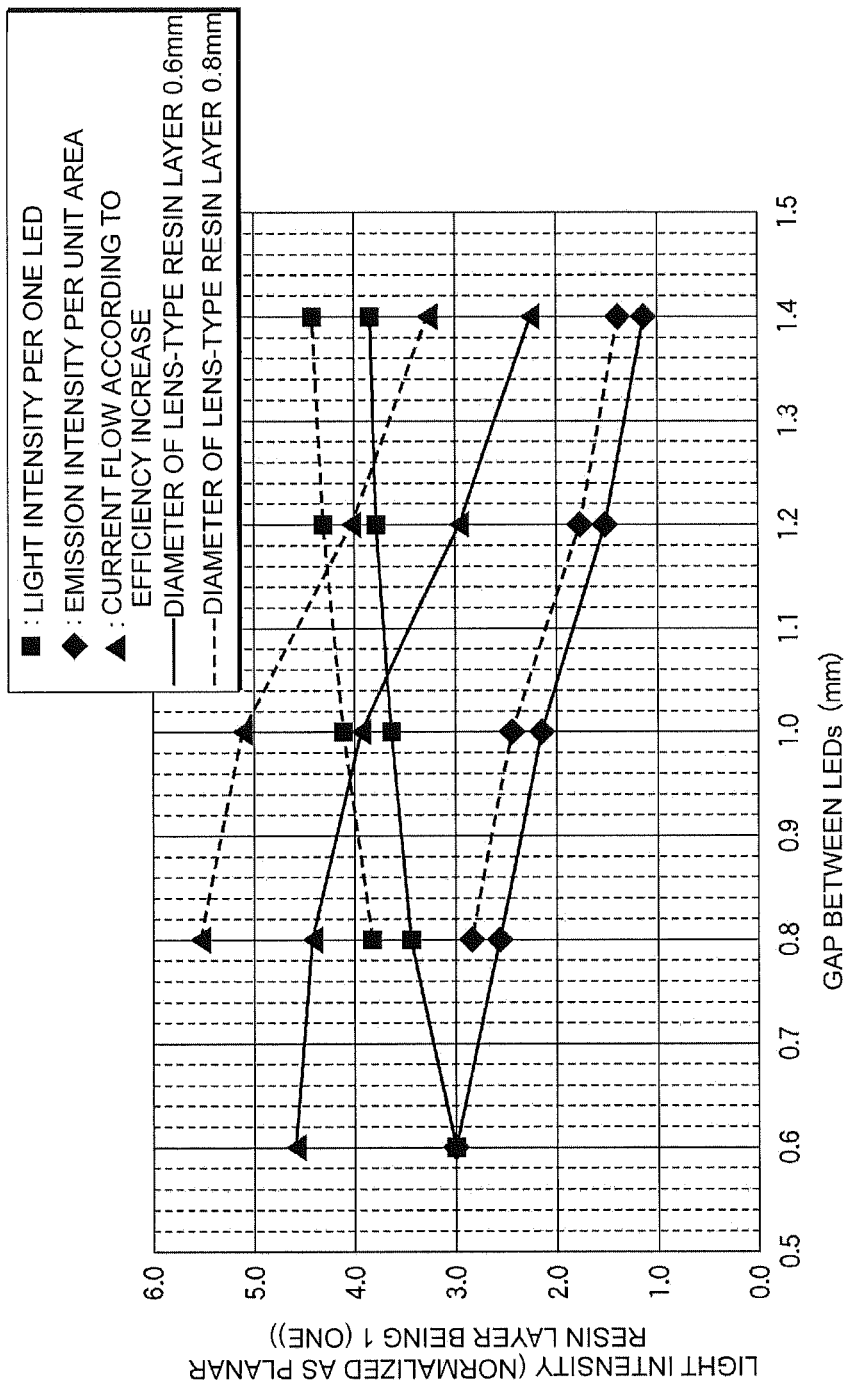
FIG. 17 is a graph showing the result of the simulation in FIG. 16.
Figure 18:
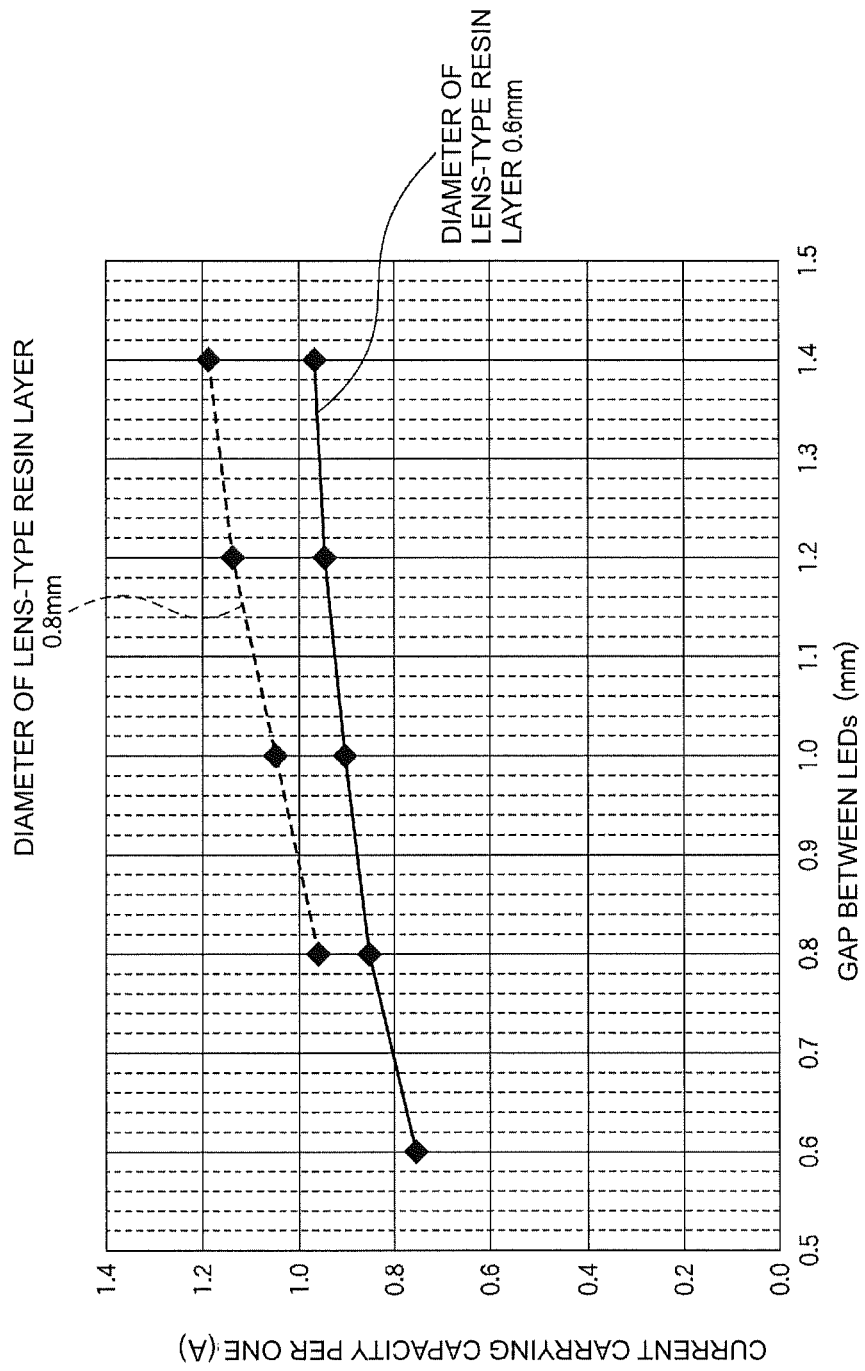
FIG. 18 is a graph showing the relationship between the gap between LEDs and the current carrying capacity per one zone under the condition shown in FIG. 16.

Next, as shown in FIG. 16, the same hemispherical resin layers as that in FIG. 10 were formed with a gap therebetween, and then the diameter of the lens layer was changed from 0.6 to 0.8 mm$\phi$. Also, the gap between adjacent LEDs was changed from 0.6 to 1.4 mm, and the reflectivity of a support was set as 0.8. The result is shown in FIG. 17. As shown in FIG. 17, in a case where the diameter of the lens layer was fixed, and the gap between adjacent LEDs (that is, the gap between adjacent lens layers) was changed, the emission intensity (extraction efficiency) per one LED is slightly increased according to an increase in the gap while the emission intensity per unit area shows a tendency to be reduced. Also, when based on the increase in the current carrying capacity per one LED as shown in FIG. 18, the current value was increased (as shown as a triangular plot), the result shows the same tendency as described above. From FIG. 17, it can be seen that the gap between adjacent LEDs is preferably 1.0 mm or less. Herein, the gap between adjacent lens layers is 0.4 mm or less when the diameter of a lens layer is 0.6 mm$\phi$, and the gap is 0.2 mm or less when the diameter of a lens layer is 0.8 mm$\phi$.

Hereinafter, a method for forming such a lens layer 20 will be described.

The lens layer 20 made of a transparent resin has a very small diameter of about 1 mm or less, as described above. Thus, it is not easy to form the lens layer 20 on the entire surface where multiple square LEDs 33 with a length of 0.5 mm on each side are put, and also, a lens layer made of a general thermosetting resin is streamed down. Therefore, it is difficult to form a required lens shape by the lens layer 20.

As preferable methods for forming the lens layers 20 with a very small size along the arranged multiple LEDs 33, there are three methods:

(1) droplet spray UV curing method,
(2) fine particle spray thin film layering method, and
(3) droplet coating centrifugal force method.

Figure 19:
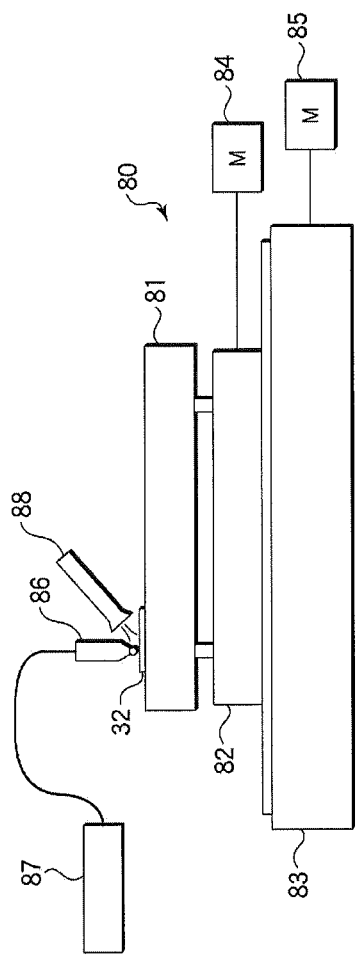
FIG. 19 is a view illustrating a schematic configuration of a device for forming a lens layer by a droplet spray UV curing method.

First, in (1) droplet spray UV curing method, an X-Y stage 80 is used, as shown in FIG. 19. The X-Y stage 80 includes an arrangement stage 81 for arrangement, an X stage 82 for moving the arrangement stage 81 in the X direction, and a Y stage 83 for moving the X stage 82 in the Y direction, an X-axis driving motor 84, and a Y-axis driving motor 85. In this method, a support 32 mounted with multiple LEDs is arranged and fixed on the arrangement stage 81, a silicon resin is supplied from a dispenser 87 to a syringe 86. Thus, the droplets of the silicon resin are dropped from the syringe 86 to the LEDs of the support 32, and the dropped droplets are momentarily cured by irradiating UV rays from a UV lamp 88 provided adjacently to the support 32. This makes it possible to form a lens type even if there exists a bonding wire. When the above described operation is repeatedly performed on the multiple LEDs through the position change on the X-Y stage 80, lens layers on the respective LEDs can be formed.

Figure 20:
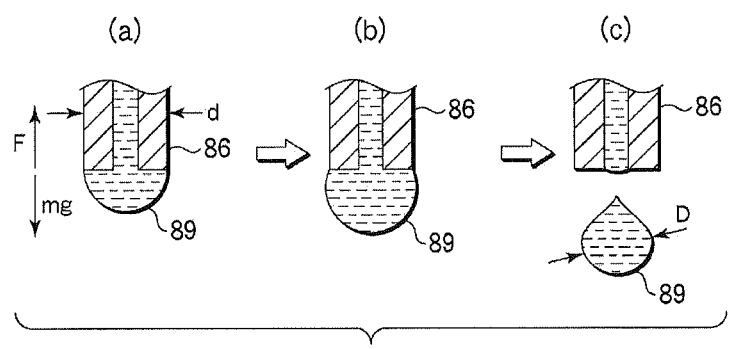
FIG. 20 is a view illustrating a method for controlling the size of a droplet during the formation of a lens layer by a droplet spray UV curing method.

Herein, the dropping mechanism of the droplets is shown in FIG. 20. Before the dropping of the droplets, as shown in 20a, a droplet 89 of the silicon resin is maintained at the leading end of the syringe 86. In this state, the tension F is larger than the force mg by gravity. When the diameter D of the droplet is gradually increased as shown in FIG. 20b, thereby increasing mg up to F (i.e., F=mg), the droplet 89 is dropped as shown in FIG. 20c. Herein, in the case where the diameter of the syringe is d, and the surface tension is S, the tension F may be expressed as:

$$F = S \cdot d\pi.$$

Also, the mass m of the droplet (waterdrop) is expressed as $$m = (4/3)\pi (D/2)^3.$$

Accordingly, when these are substituted into F=mg, the diameter D of a dropping droplet is determined as $$D = \{(6/g)S \cdot d\}^{1/3}.$$

In other words, the diameter of the droplet can be adjusted to be a required value according to the selection of the above mentioned parameters. Thus, it is possible to arbitrarily determine the size of the lens layer 20. Actually, a correction term is added to the above mentioned theoretical equation to set the condition.

Hereinafter, (2) fine particle spray thin film layering method will be described.

Figure 21A:
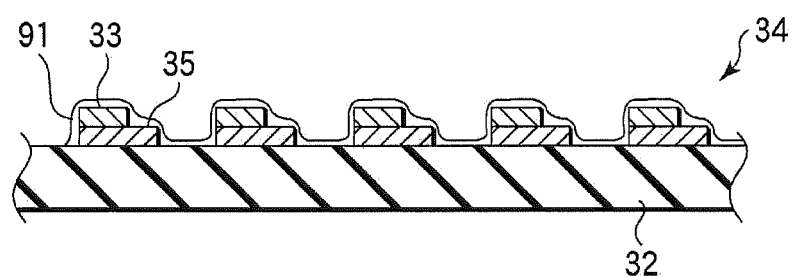
FIG. 21A is a view illustrating the sequence for forming a lens layer by a fine particle spray thin film layering method.
Figure 21B:
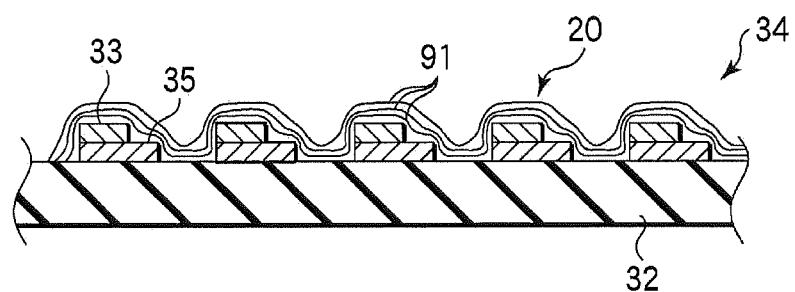
FIG. 21B is a view illustrating the sequence for forming a lens layer by a fine particle spray thin film layering method.

In this method, a liquid is guide-sprayed by compressed air, and the sprayed liquid is cured to form a thin layer 91 on an LED array 34, as shown in FIG. 21a. Also, as shown in FIG. 21b, a multi-layered structure is formed through the repetition of this operation a predetermined number of times, thereby forming a lens layer 20 along LEDs 33 as a base. Herein, in guide-spraying by the compressed air, the liquid can be sprayed into fine particles with a size of about 10 μm, thereby achieving a high shape control property. In this case, the shape control of the lens layer 20 may be performed by the thickness of the layer 91, the number of times of repetitions, or the like.

Hereinafter, (3) droplet coating centrifugal force method will be described.

Figure 22:
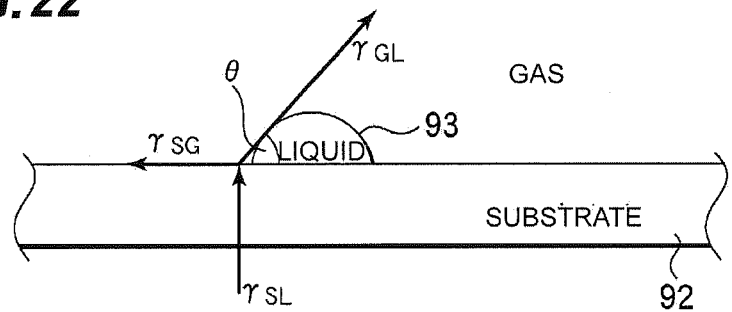
FIG. 22 is a view illustrating the principle in the formation of a lens layer by a droplet coating centrifugal force method.

As shown in FIG. 22, when a liquid 93 is dropped onto a substrate 92, tensions occur at an interface between gas, liquid, and solid (substrate). Interfacial tension between solid and liquid: $\gamma_{SL}$, surface tension between solid and gas: $\gamma_{SG}$, and surface tension between gas and liquid: $\gamma_{GL}$ have the following relationship therebetween:

$$\gamma_{SG} = \gamma_{SL} + \gamma_{GL} \cos \theta.$$

From the equation $$\theta = \cos^{-1}\{(\gamma_{SG} - \gamma_{SL})/\gamma_{GL}\}$$

is induced.

Figure 23:
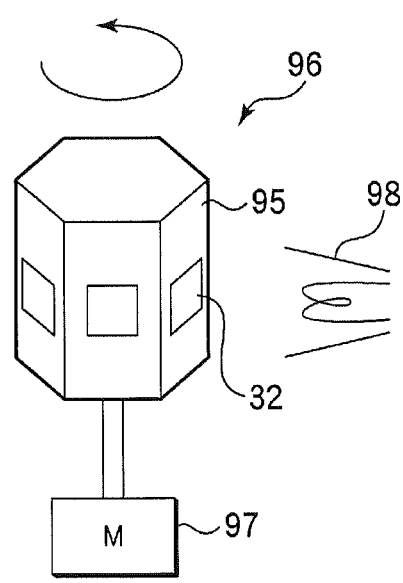
FIG. 23 is a view illustrating a device for forming a lens layer by a droplet coating centrifugal force method.

In other words, since θ increases as $\gamma_{GL}$ decreases, it is possible to control the shape of droplets. Also, $\gamma_{GL}$ may be controlled by a centrifugal force. As shown in FIG. 23, a support 32 mounted with LEDs is attached onto each surface 95 of a rotating body 96 having a polygonal cross-section. When the rotating body 96 is rotated by a motor 97, a centrifugal force is generated from the support 32 toward the outside. Accordingly, it is possible to adjust the centrifugal force by adjusting the number of times of rotation, and thus $\gamma_{GL}$ can be controlled. Then, a lens-type resin layer with a required shape is formed through the curing by a UV lamp 98.

A lens layer 20 can be formed by a relatively simplified device according to the above described, methods, but the present invention is not limited thereto. A frame may be used to flow in a silicon resin in another method. In a case where a frame is used, since there is no need to consider the stream of the resin, it is not necessary to employ the above described methods for forming a hemispherical resin layer after forming a thin resin layer.

Hereinafter, an annealing operation in the annealing device 100 as described above will be described.

First, the wafer W is loaded via the loading/unloading hole 12 by opening the gate valve 13, and is disposed on the supporting member 7. Then, the gate valve 13 is closed to place the inside of the processing chamber 1 in an airtight condition, and the inside of the processing chamber 1 is exhausted by an exhaust device (not shown) via the exhaust pipe 11. Next, a predetermined processing gas, such as argon gas or nitrogen gas, is introduced into the processing chamber 1 from a processing gas supply mechanism (not shown) via the processing gas pipe 9 and the processing gas inlet port 8, thereby maintaining the pressure within the processing chamber 1 at a predetermined pressure within a range of 100 to 10000 Pa.

Meanwhile, a liquid-state cooling medium, such as a fluorinated inert liquid (Florinate, Galden, or the like (trade name)) is circulated in the cooling medium flow passages 21a and 21b of the cooling members 4a and 4b, thereby cooling the LEDs 33 to a predetermined temperature of 0° C. or less, preferably of −50° C. or less.

Then, a predetermined current is supplied to the LEDs 33 from power supply (not shown) via the control boxes 37a and 37b, the power-feeding member 41, the electrode rod 38, the power feeding electrodes 51, and the electrode 35, thereby lighting the LEDs 33. Then, the annealing is started.

Herein, since the LEDs 33 are covered with the lens layers 20, the light is not directly emitted from the LEDs 33 made of a high refractive index material (such as GaAs or GaN) to the air having a low refractive index. Thus, the efficiency loss which can be caused by total reflection hardly occurs. Also, the lens layers 20 typically take a hemispherical shape, and thus can effectively extract the light laterally emitted from the LEDs 33 to the outside. Accordingly, it is possible to more highly efficiently extract the light, compared to the case where the planar resin layer is formed on the LEDs 33. Also, in this case, it is possible to achieve a higher extraction efficiency of the light by optimizing the size of the lens layers 20 or the disposition interval of the LEDs. Also, since the contribution of the light reflected from the support 32 increases according to an increase in the reflectivity of the support 32, it is possible to further increase the extraction efficiency of the light.

Also, if the LEDs 33 are maintained at a room temperature, the light emission amount is reduced by the heating of the LEDs 33, or the like. However, in the present exemplary embodiment, the cooling medium passes through the cooling members 4a and 4b, thereby cooling the LEDs 33 via the cooling members 4a and 4b, the support 32, and the electrode 35, as shown in FIG. 2. Thus, it is possible to efficiently cool the LEDs 33. In other words, cold heat is accumulated by cooling the cooling members 4a and 4b made of a high heat conductive material (such as copper) by the cooling medium, and the accumulated cold heat cools the LEDs 33. However, the cooling members 4a and 4b have a much higher heat capacity than the LEDs, and the cold heat of the cooling members 4a and 4b is supplied to the LEDs 33 via the electrode 35 and the support 32, which are highly heat conductive and are in overall contact with the cooling members 4a and 4b. Accordingly, it is possible to sufficiently cool the LEDs 33 by the accumulated cold heat without circulation of a large amount of cooling medium.

Hereinafter, a second exemplary embodiment of the present invention will be described.

Figure 24:
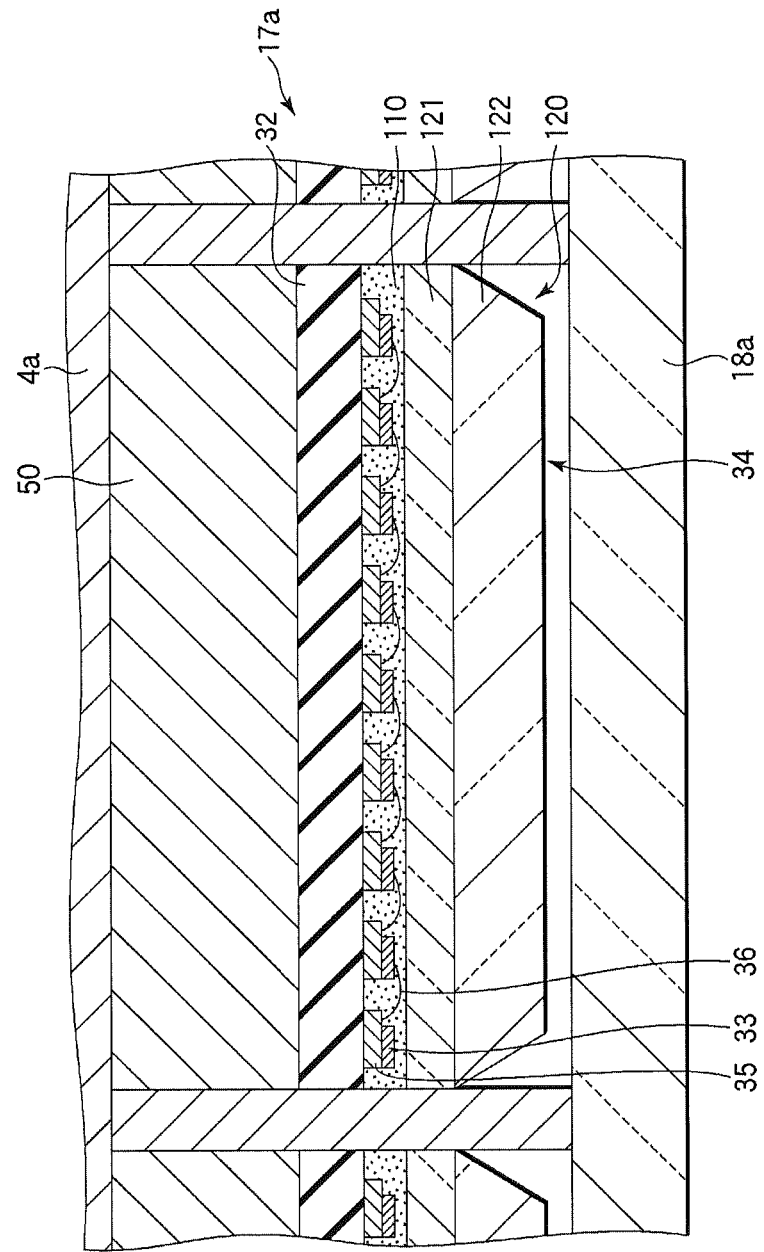
FIG. 24 is an enlarged cross-sectional view illustrating a heating source of an annealing device according to a second exemplary embodiment of the present invention.

The annealing device according to the present exemplary embodiment is configured in the same manner as that in the first exemplary embodiment, except that the aspect of formation of a lens layer in heating sources 17a and 17b is different. In other words, the present exemplary embodiment uses a configuration where a predetermined number of LEDs 33 in a lump are covered with a lens layer. Specifically, for example, as shown in FIG. 24, LEDs 33 of one LED array 34 are in a lump embedded in a buried resin layer 110, and a lens layer 120 covering these LEDs 33 in a lump is formed thereon. The lens layer 120 includes a planar lens portion 121 and a main lens portion 122 on the planar lens portion 121. The planar lens portion 121 is made of quartz or resin and forms a planar shape, and the main lens portion 122 is made of resin and forms a circular truncated cone shape.

Due to the covering of a plurality of LEDs 33 as light emitting elements in a lump with the lens layer 120 as described above, when the light is emitted from the LEDs 33 made of a high refractive index material to the air having a low refractive index, total reflection hardly occurs. Thus, the efficiency loss caused by total reflection can be inhibited. Also, it is possible to effectively extract the light laterally emitted from the LEDs 33, thereby further increasing the extraction efficiency of the light.

The extraction efficiency of the light is slightly low in the present exemplary embodiment, compared to that in the first exemplary embodiment. However, since the lens layer 120 is formed for each LED array 34, the fabrication process is simple, compared to the first exemplary embodiment.

Figure 25:
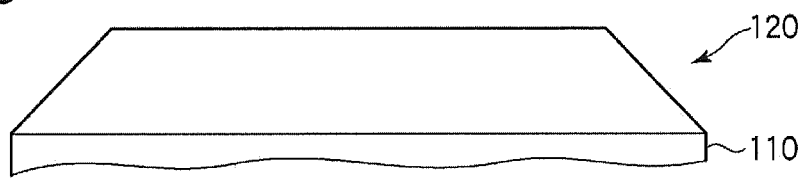
FIG. 25 is a mimetic diagram illustrating another example of a lens layer according to a second exemplary embodiment of the present invention.
Figure 26:
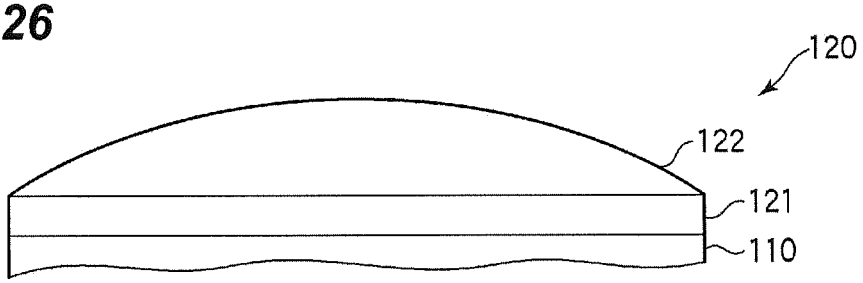
FIG. 26 is a mimetic diagram illustrating a further example of a lens layer according to a second exemplary embodiment of the present invention.
Figure 27:
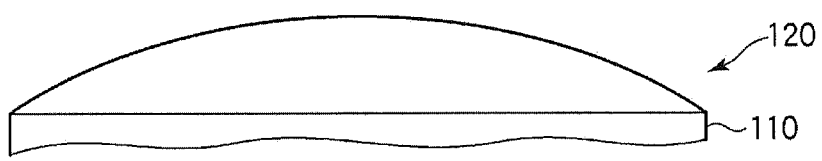
FIG. 27 is a mimetic diagram illustrating a still further example of a lens layer according to a second exemplary embodiment of the present invention.

Although the lens layer 120 includes the planar shaped planar lens portion 121 made of quartz or resin, and the circular truncated cone shaped main lens portion 122 made of resin from the standpoint of ease in the fabrication, the lens layer 120 may form a circular truncated cone shape on the whole as shown in FIG. 25. Also, as shown in FIG. 26, the main lens portion 122 may form a spherical shape, and as shown in FIG. 27, the lens layer 120 may form a spherical shape on the whole.

Hereinafter, the optical output obtained by the use of the lens layer 120, on a light receiving surface corresponding to the wafer W, will be described through the comparison with the case where the lens layer is not used.

As an LED, GaAs with a size of 0.5 (L)×0.5 (W)80.2 (H) mm was used. The LEDs were disposed on a surface of 270 mm$^2$, and were embedded in a silicon resin layer, and then a lens layer (total thickness: 12 mm) was formed thereon. The lens layer includes a quartz planar lens portion of 50 mm$\phi$×3 mm, and a silicon resin main lens portion (taper: about) 50°) (bottom portion: 50 mm$\phi$, top portion: 35 mm$\phi$, height: 9 mm) which has a circular truncated cone shape and is formed on the planar lens portion. Herein, the optical output was obtained and was compared to the case where the lens layer was not formed.

First, the comparison was carried out by simulation.

Figure 29:
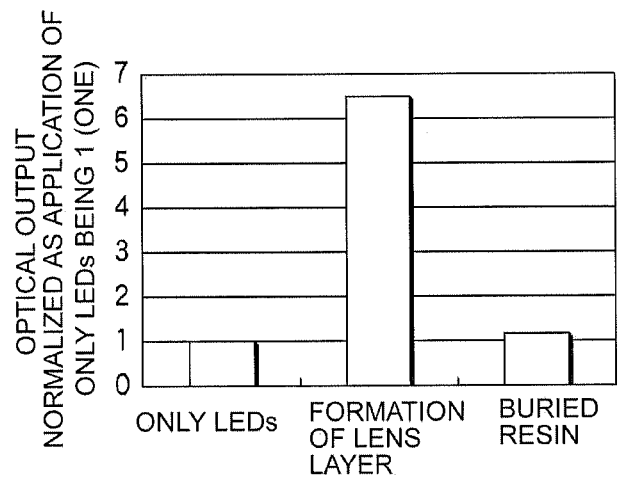
FIG. 29 is a view illustrating the results of optical output simulations according to the formation of a lens layer, the application of only LEDs, and the formation of only a buried resin.

Herein, a LightTools program available from Optical Research Associate was used as a simulator, the reflectivity of an adjacent LED was set as 0.2, and the reflectivity of a support was set as 0.8. Then, the optical output by the application of LEDs only, and the optical output by the formation of a lens layer were simulated. Also, in the same manner, the case where the LEDs were embedded in a buried resin, and a lens layer was not formed was simulated. The result is shown in FIG. 29. In FIG. 29, the optical output was normalized as the optical output of the application of only LEDs being 1 (one). From the drawing, it can be seen that the formation of a lens layer can achieve the optical output six times higher than the application of only LEDs. Meanwhile, the case where the LEDs were embedded in the buried resin without the use of the lens layer showed the optical output slightly higher than the application of only LEDs.

Figure 28:
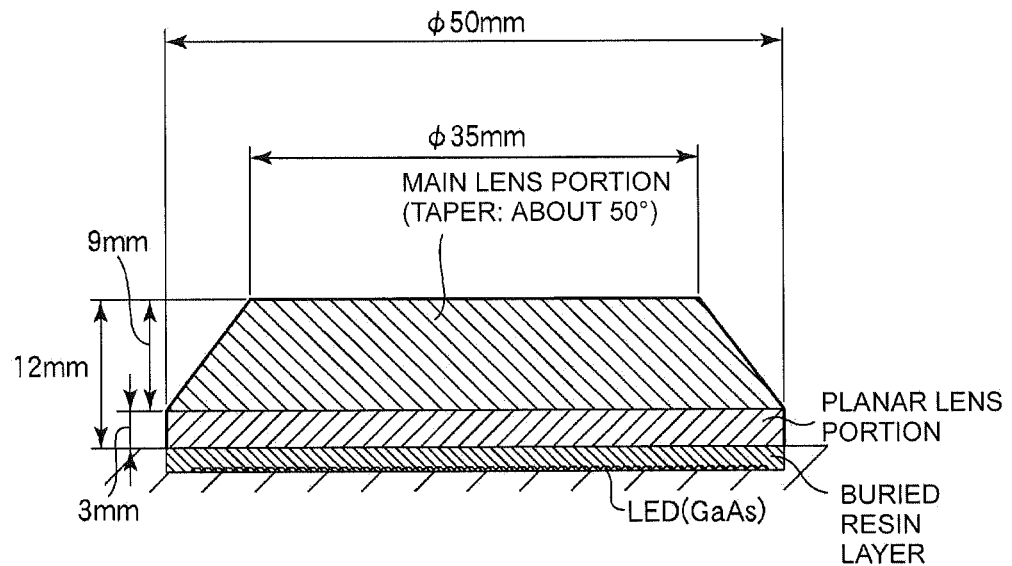
FIG. 28 is a cross-sectional view illustrating the specific structure of a heating source by which the optical output was measured according to a second exemplary embodiment of the present invention.

Next, in the structure shown in FIG. 28, the optical output was measured through the light emission of LEDs As a result, it was found that it is possible to achieve the optical output 1.5 times higher than the application of only LEDs.

Hereinafter, a third exemplary embodiment of the present invention will be described.

In the annealing device according to the present exemplary embodiment, an LED has a characteristic shape, while heating sources 17a and 17b may have or may not have the lens layer of the first or second exemplary embodiment formed therein. Other components are the same as those in the first and second exemplary embodiments.

Figure 30A:
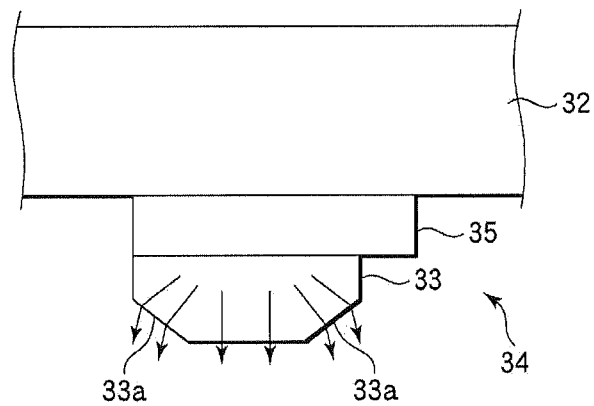
FIG. 30A is a cross-sectional view illustrating the structure of an LED used for an annealing device according to a third exemplary embodiment of the present invention.
Figure 30B:
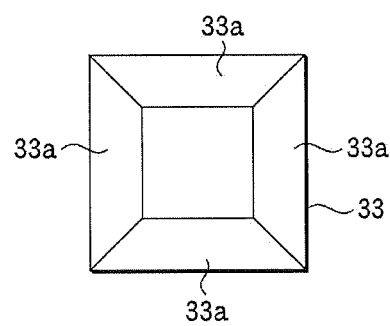
FIG. 30B is a bottom view illustrating the structure of an LED used for an annealing device according to a third exemplary embodiment of the present invention.

An LED 33 according to the present exemplary embodiment, as shown in the cross-sectional view in FIG. 30a, and in the bottom view in FIG. 30b, has a chamfer portion 33a formed at the edge portion of a light emitting side. Due to the formation of the chamfer portion 33a, when the light emitted from the inside of the LED 33 is emitted to the outside, the light is refracted from the chamfer portion 33a to the center side. In other words, the chamfer portion 33a has a function of guiding the horizontal directional light to a center. This increases the extraction efficiency of the light, and thereby achieves a higher optical output on the wafer W, compared to a case where there is no chamfer portion 33a.

Figure 31:
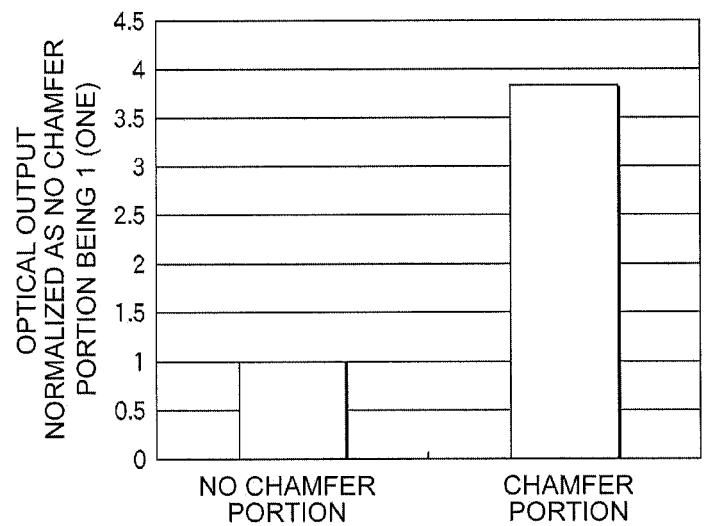
FIG. 31 is a view illustrating the simulation result of comparison of the optical output of an LED having a chamfer portion, which is used for a third exemplary embodiment of the present invention, with the case where a conventional LED has no chamfer portion.

Hereinafter, the optical output of the LED according to the present exemplary embodiment will be described by the simulation result through the comparison with a conventional LED without chamfer portion. Herein, a LightTools program available from Optical Research Associate was used as a simulator. In a case where the LED has a size of 0.6 (L)×0.6 (W)×0.6 (H) mm, and the chamfer portion is set as 0.2 mm, the optical output in the opposite light receiving surface was obtained. The result is shown in FIG. 31. In this drawing, the optical output was normalized as the optical output of an LED having no chamfer portion being 1 (one). From the drawing, it can be seen that the formation of a chamfer portion on an LED can achieve the optical output three or more times higher than the formation of no chamfer portion.

The present invention is not limited to the embodiments described above, but it may be variously modified. For example, in the above described embodiments, heating sources with LEDs are provided at both sides of a wafer as a to-be-treated object, but the present invention is not limited thereto. A heating source may be provided at any one side of the wafer. Also, in the above described embodiments, an LED is used as a light emitting element, but other light emitting elements, including a semiconductor laser, may be used. Also, a to-be-treated object is not limited to the semiconductor wafer. Other substrates, such as a glass substrate for FPD, may be used as the to-be-treated object.

The present invention is appropriate for the use requiring rapid-heating, such as annealing on a semiconductor wafer with impurities implanted therein.

What is claimed is:
1. An LED array comprising:
a heat diffusing member;
a supporting member stacked on the heat diffusing member; and
a plurality of LEDs attached on the supporting member toward an object to be processed, thereby forming an LED array for heating the object to be processed,
wherein the heat diffusing member is made of copper, and the supporting member is made of aluminum nitride (AlN) and coated with TiO$_2$.
2. The LED array of claim 1, wherein the LED array is formed with a hexagonal shape.
3. The LED array of claim 2, wherein the plurality of LEDs are made of any one of GaN, GaAs and GaP.

4. The LED array of claim 2, wherein each of the plurality of LEDs is individually covered with a lens layer.

5. The LED array of claim 4, wherein the lens layer is made of a transparent resin.

6. The LED array of claim 4, wherein the lens layer is formed with a hemispherical shape.

7. The LED array of claim 4, wherein the lens layer is in contact with other adjacent lens layers.

8. The LED array of claim 4, wherein the lens layer is separated from other adjacent lens layers.

9. The LED array of claim 4, wherein the lens layer has a refractive index value between the refractive index of LEDs and air.

\* \* \* \* \*